United States Patent
Katani et al.

(10) Patent No.: US 9,136,107 B2
(45) Date of Patent: Sep. 15, 2015

(54) SEMICONDUCTOR DEVICE AND METHOD FOR MANUFACTURING SEMICONDUCTOR DEVICE

(71) Applicant: Transphorm Japan, Inc., Yokohama, Kanagawa (JP)

(72) Inventors: Yoshiyuki Katani, Aizuwakamatsu (JP); Shinichi Akiyama, Aizuwakamatsu (JP)

(73) Assignee: Transphorm Japan, Inc., Yokohama (JP)

(*) Notice: Subject to any disclaimer, the term of this patent is extended or adjusted under 35 U.S.C. 154(b) by 12 days.

(21) Appl. No.: 14/098,853

(22) Filed: Dec. 6, 2013

(65) Prior Publication Data
US 2014/0191288 A1    Jul. 10, 2014

(30) Foreign Application Priority Data
Jan. 9, 2013  (JP) .................. 2013-001777

(51) Int. Cl.
*H01L 29/66* (2006.01)
*H01L 21/02* (2006.01)
*H01L 29/778* (2006.01)
*H01L 29/20* (2006.01)

(52) U.S. Cl.
CPC .... *H01L 21/02112* (2013.01); *H01L 29/66462* (2013.01); *H01L 29/7787* (2013.01); *H01L 29/2003* (2013.01)

(58) Field of Classification Search
USPC .................. 257/194, 330; 438/172
See application file for complete search history.

(56) References Cited

U.S. PATENT DOCUMENTS

| | | | |
|---|---|---|---|
| 2008/0197453 A1* | 8/2008 | Kanamura et al. | 257/615 |
| 2010/0012977 A1* | 1/2010 | Derluyn et al. | 257/194 |
| 2011/0042719 A1 | 2/2011 | Sazawa | |
| 2012/0217545 A1* | 8/2012 | Kamada | 257/194 |
| 2013/0240896 A1* | 9/2013 | Ozaki | 257/76 |
| 2013/0292698 A1* | 11/2013 | Then et al. | 257/76 |
| 2014/0264564 A1* | 9/2014 | Cheng et al. | 257/330 |

FOREIGN PATENT DOCUMENTS

| | | | |
|---|---|---|---|
| JP | 2007-88275 A1 | 4/2007 | |
| JP | 2008-205175 A1 | 9/2008 | |
| JP | 2008-226907 A1 | 9/2008 | |
| JP | 2009-231395 A1 | 10/2009 | |

* cited by examiner

*Primary Examiner* — Errol Fernandes
(74) *Attorney, Agent, or Firm* — Fish & Richardson P.C.

(57) ABSTRACT

A method for manufacturing a semiconductor device includes forming an electron transit layer on a semiconductor substrate, forming an electron supply layer on the electron transit layer, forming a cap layer on the electron supply layer, forming a protection layer on the cap layer, the protection layer having an opening part, through which a part of the cap layer is exposed, and forming an oxidation film on an exposed surface of the cap layer by a wet process.

6 Claims, 29 Drawing Sheets

EELS ANALYSIS POSITIONS

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of prior Japanese Patent Application No. 2013-001777 filed on Jan. 9, 2013, the entire contents of which are incorporated herein by reference.

FIELD

Embodiments relate to a semiconductor device and a method for manufacturing the semiconductor device.

BACKGROUND

High-pressure and high-power devices are being actively developed with the use of characteristics such as high saturation electron velocity, wide band gap or the like in compound semiconductor elements. With respect to the compound semiconductor elements, a number of reports about field effect transistors, in particular HEMTs (High Electron Mobility Transistors) have been published. With respect to the HEMTs, an AlGaN/GaN (gallium nitride) HEMT with AlGaN (aluminum gallium nitride) as an electron supply layer is well-known. In the AlGaN/GaN HEMTs, distortions caused by the difference of grating constants between AlGaN and GaN occur in AlGaN. Due to piezo-polarization induced by the distortions, a high concentration two-dimensional electron gas is obtained, so that high-power devices can be achieved with the AlGaN/GaN HEMTs.

[Patent document 1] Japanese Laid-open Patent Publication No. 2007-88275

[Patent document 2] Japanese Laid-open Patent Publication No. 2008-205175

[Patent document 3] Japanese Laid-open Patent Publication No. 2008-226907

[Patent document 4] Japanese Laid-open Patent Publication No. 2009-231395

SUMMARY

According to an aspect of the embodiments, a method for manufacturing a semiconductor device includes, forming an electron transit layer on a semiconductor substrate, forming an electron supply layer on the electron transit layer, forming a cap layer on the electron supply layer, forming a protection layer on the cap layer, the protection layer having an opening part, through which a part of the cap layer is exposed, and forming an oxidation film on an exposed surface of the cap layer by a wet process.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A semiconductor device and a method for manufacturing the semiconductor device according to the present embodiments will now be described with reference to the accompanying drawings. Configurations in the following first and second embodiments are illustrative, and the semiconductor device and the method for manufacturing the semiconductor device according to the present embodiments are not limited to the configurations in the first and second embodiments.

First Embodiment

Figure 1:
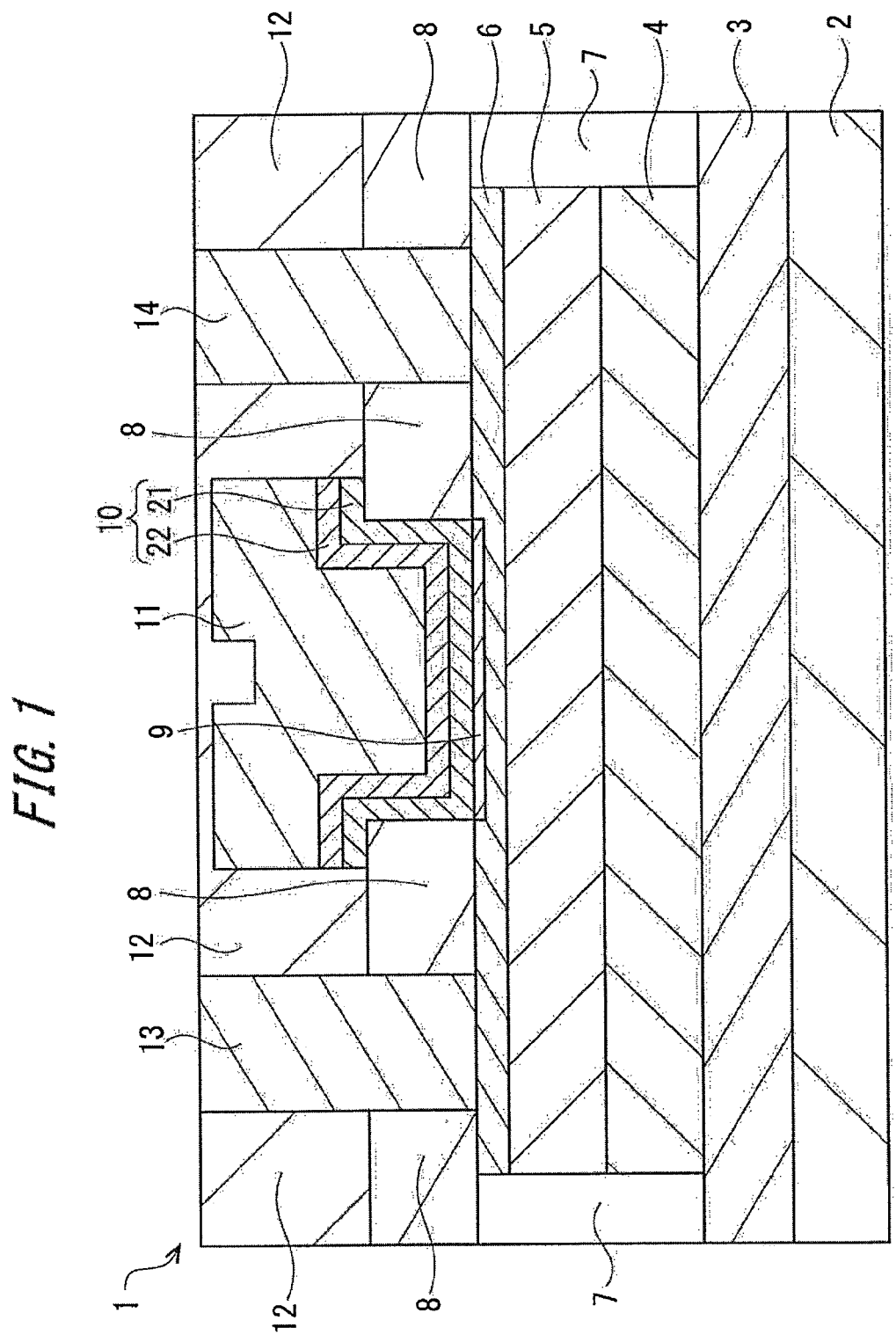
FIG. 1 is a cross-sectional view of the semiconductor device 1 according to a first embodiment.

A semiconductor device 1 and a method for manufacturing the semiconductor device 1 according to a first embodiment will be described. In the first embodiment, a compound semiconductor element having a HEMT (High Electron Mobility Transistor) structure, which is one example of semiconductor device, will be described as an example. FIG. 1 is a cross-sectional view of the semiconductor device 1 according to the first embodiment. The semiconductor device 1 includes a semiconductor substrate 2, a buffer layer 3, an electron transit layer 4, an electron supply layer 5, a cap layer 6, an element isolation region 7, a protection layer 8, an oxidation film 9, a gate insulating film 10, a gate electrode 11, a passivation layer 12, a source electrode 13 and a drain electrode 14.

The semiconductor substrate 2 is a Si (silicon) substrate or a SiC (silicon carbide) substrate, for example. The buffer layer 3 is an AlxGa(1−x)N layer (wherein, x is more than zero and less than or equal to one), for example. Without being limited to the above-described layer, the buffer layer 3 may also be an AlN (aluminum nitride) layer, an InGaN (indium gallium nitride) layer or a GaN layer. The buffer layer 3 has a function of enhancing the crystallinity of the electron transit layer 4. In the first embodiment, formation of the buffer layer 3 may be omitted.

The electron transit layer 4 is a GaN layer, for example. The electron transit layer 4 may also be an InGaN layer or an InAlGaN layer. The GaN layer may be an n-GaN layer which is doped with n-type impurities, or an undoped i-GaN layer. The InGaN layer may be an n-InGaN layer or an i-InGaN layer. The InAlGaN layer may be an n-InAlGaN layer or an i-InAlGaN layer.

The electron supply layer 5 is an n-Al(1−x)GaN (wherein, x=0.15 to 0.25) layer, for example. The electron supply layer 5 may also be an n-InGaN layer or an n-InAlGaN (indium aluminum gallium nitride) layer. The cap layer 6 is an n-GaN layer or an i-GaN layer, for example. On the cap layer 6, the oxidation film 9 is formed in the part where the cap layer 6 and the gate insulating film 10 contact to each other. In other words, the cap layer 6 has the oxidation film 9 at the interface between the cap layer 6 and the gate insulating film 10. The gate insulating film 10 has a first gate insulating film 21 and a second gate insulating film 22. The first gate insulating film 21 is an AlN film, for example. The second gate insulating film 22 is a SiN film, for example. The passivation layer 12 is a SiO layer or a SiN layer, for example.

Figure 2:
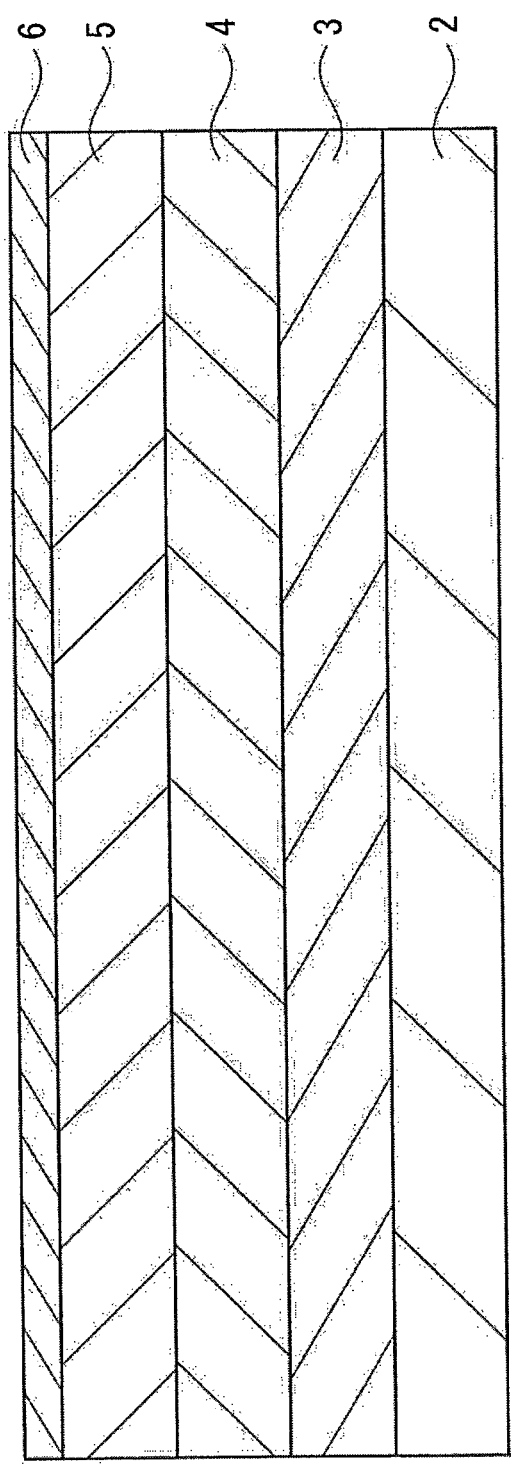
FIG. 2 is a view illustrating processes of forming a buffer layer 3, an electron transit layer 4, an electron supply layer 5 and a cap layer 6 on a semiconductor substrate 2.

The method for manufacturing the semiconductor device 1 according to the first embodiment will be described. In the method for manufacturing the semiconductor device 1 according to the first embodiment, at first, as illustrated in FIG. 2, the buffer layer 3 is formed on the semiconductor substrate 2 by the MOCVD (Metal Organic Chemical Vapor Deposition) technique or the MBE (Molecular Beam Epitaxy) technique, for example. For example, the buffer layer 3 having a thickness of more than or equal to 1 μm and less than or equal to 3 μm (for example, 2.6 μm) is formed on the semiconductor substrate 2 by growing an AlGaN crystal on the semiconductor substrate 2.

Next, as illustrated in FIG. 2, the electron transit layer 4 is formed on the buffer layer 3 by the MOCVD technique or the MBE technique, for example. For example, the electron transit layer 4 having a thickness of more than or equal to 0.9 μm and less than or equal to 1.5 μm (for example, 1.1 μm) is formed on the buffer layer 3 by growing an i-GaN crystal on the buffer layer 3.

Then, as illustrated in FIG. 2, the electron supply layer 5 is formed on the electron transit layer 4 by the MOCVD technique or the MBE technique, for example. For example, the electron supply layer 5 having a thickness of more than or equal to 15 nm and less than or equal to 25 nm (for example, 20 nm) is formed on the electron transit layer 4 by growing an n-AlGaN (wherein, the composition ratio of Al is more than or equal to 15% and less than or equal to 20%) crystal on the electron transit layer 4.

Next, as illustrated in FIG. 2, the cap layer 6 is formed on the electron supply layer 5 by the MOCVD technique or the MBE technique, for example. For example, the cap layer 6 having a thickness of more than or equal to 2 nm and less than or equal to 5 nm (for example, 2 nm) is formed on the electron supply layer 5 by growing an n-GaN crystal on the electron supply layer 5.

Figure 3:
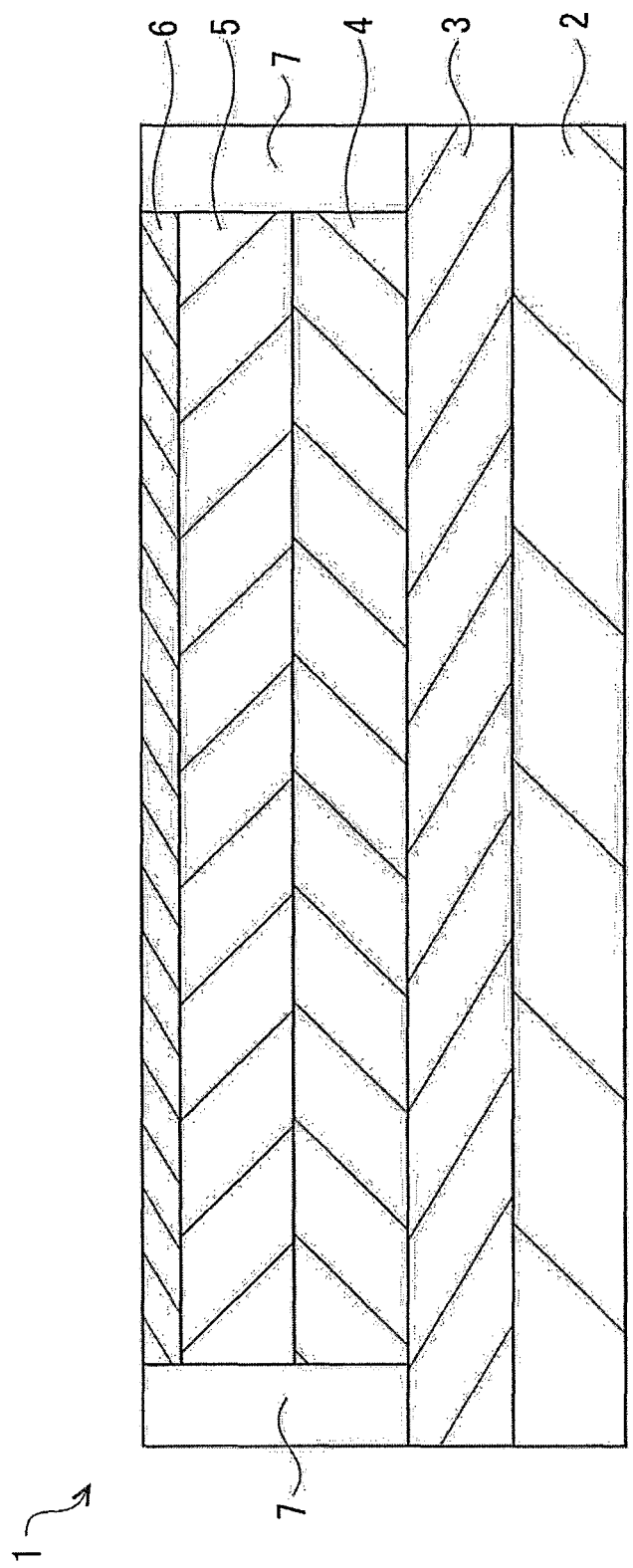
FIG. 3 is a view illustrating a process of forming an element isolation region 7 in the electron transit layer 4, the electron supply layer 5 and the cap layer 6.

Then, as illustrated in FIG. 3, the element isolation region 7 is formed in the electron transit layer 4, the electron supply layer 5 and the cap layer 6. For example, the element isolation region 7 is formed in the electron transit layer 4, the electron supply layer 5 and the cap layer 6 by performing ion implantation into the electron transit layer 4, the electron supply layer 5 and the cap layer 6 to break the crystals of the electron transit layer 4, the electron supply layer 5 and the cap layer 6. For example, ions may be continuously implanted under the following conditions.

Ion species: Ar (argon), acceleration energy: 170 keV, dose: $5E13/cm^2$

Ion species: Ar, acceleration energy: 100 keV, dose: $1E13/cm^2$ B (boron) may also be used as ion species.

Figure 4:
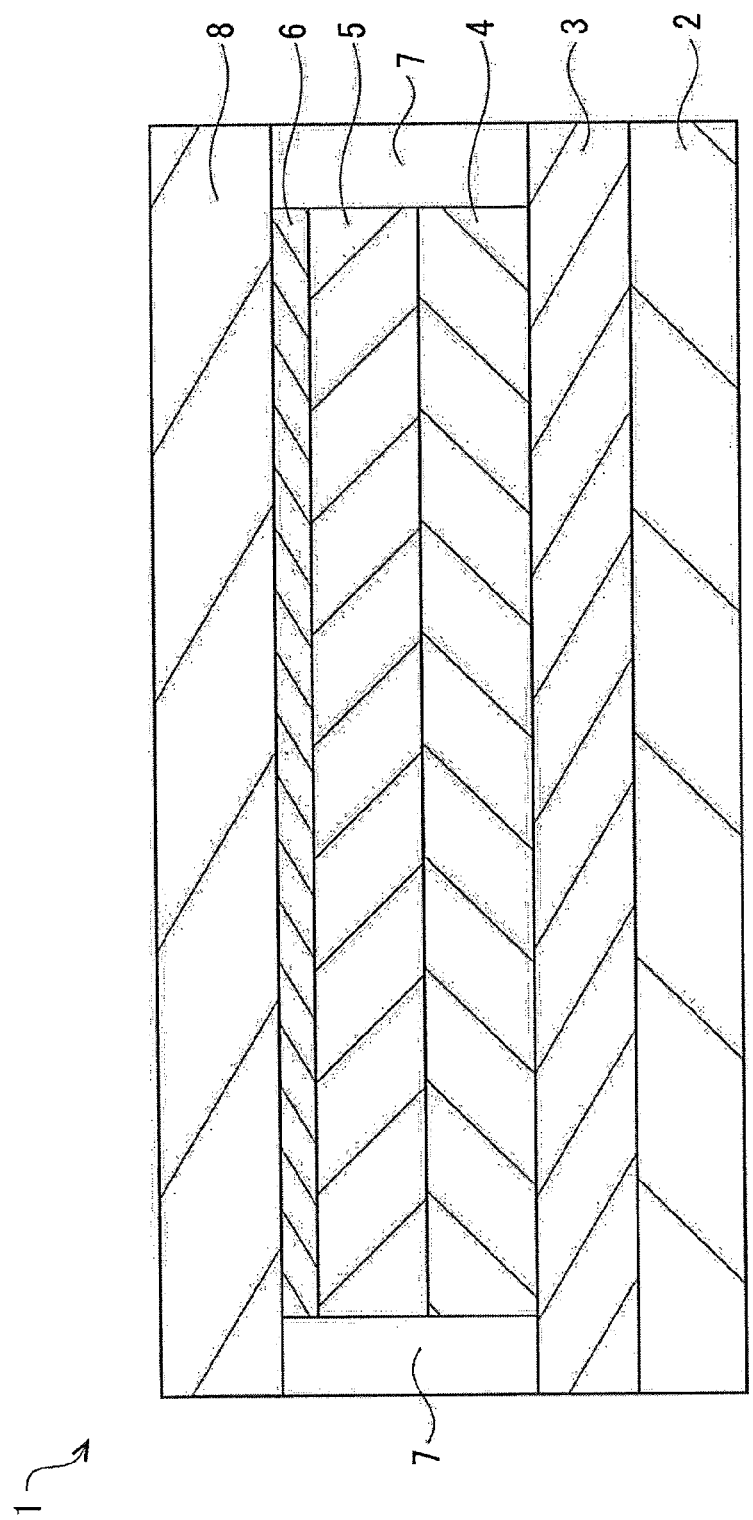
FIG. 4 is a view illustrating a process of forming a protection layer 8 on the cap layer 6.

Next, as illustrated in FIG. 4, the protection layer 8, which is an insulating layer, is formed on the cap layer 6. For example, the protection layer 8 is formed on the cap layer 6 by forming a SiN film having a thickness of more than or equal to 200 nm and less than or equal to 300 nm on the cap layer 6 by the CVD technique.

Figure 5:
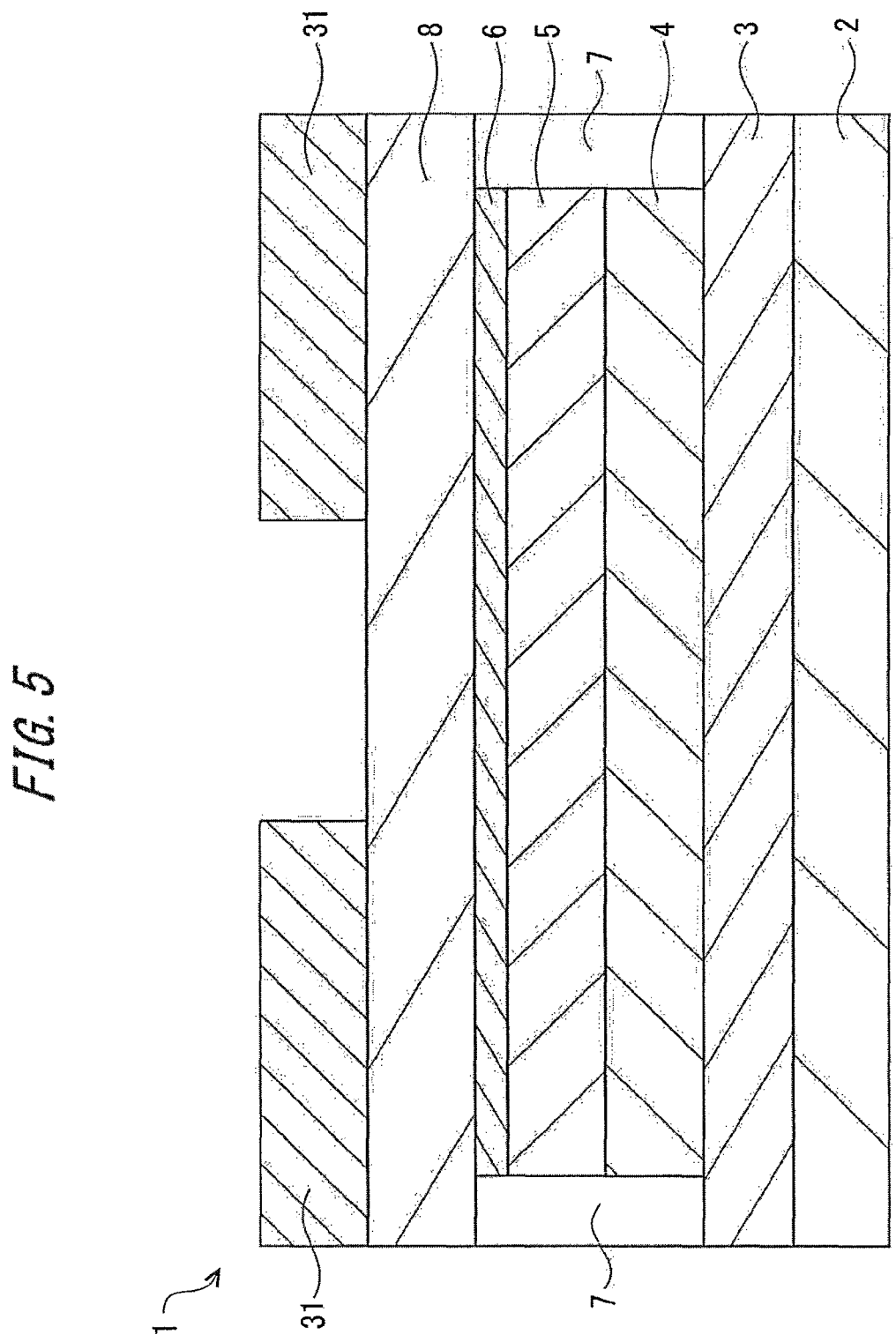
FIG. 5 is a view illustrating a process of forming a resist pattern 31 on the protection layer 8.

Then, as illustrated in FIG. 5, a resist pattern 31 with an opening in a predetermined region is formed on the protection layer 8. The predetermined region may be the region where the gate electrode 11 is formed or the region where a part of the gate electrode 11 is formed. For example, a resist (photosensitive material) is applied on the protection layer 8 to form the resist pattern 31 by photolithography.

Figure 6:
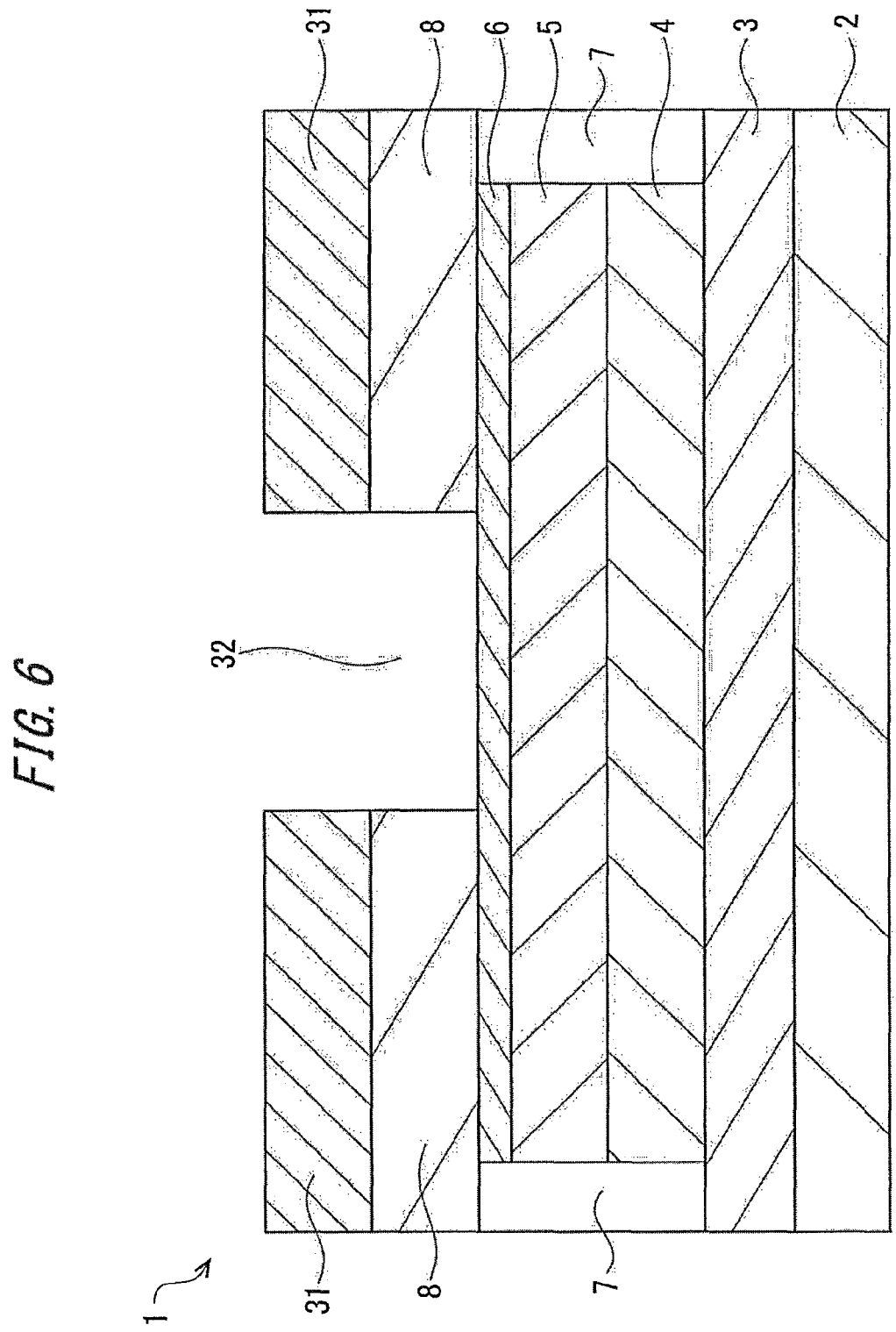
FIG. 6 is a view illustrating a process of forming an opening part 32 in the protection layer 8.

Next, as illustrated in FIG. 6, by wet-etching the protection layer 8 with a liquid chemical such as HF (hydrogen fluoride)

with the resist pattern 31 being as a mask, an opening part 32 is formed in the protection layer 8, through which a part of the top surface of the cap layer 6 is exposed. The top surface of the cap layer 6 is one face of the cap layer 6 that contacts to the protection layer 8. As a result of the processes illustrated in FIGS. 4-6, the protection layer 8 having the opening part 32 is formed, through which a part of the cap layer 6 is exposed.

Figure 7:
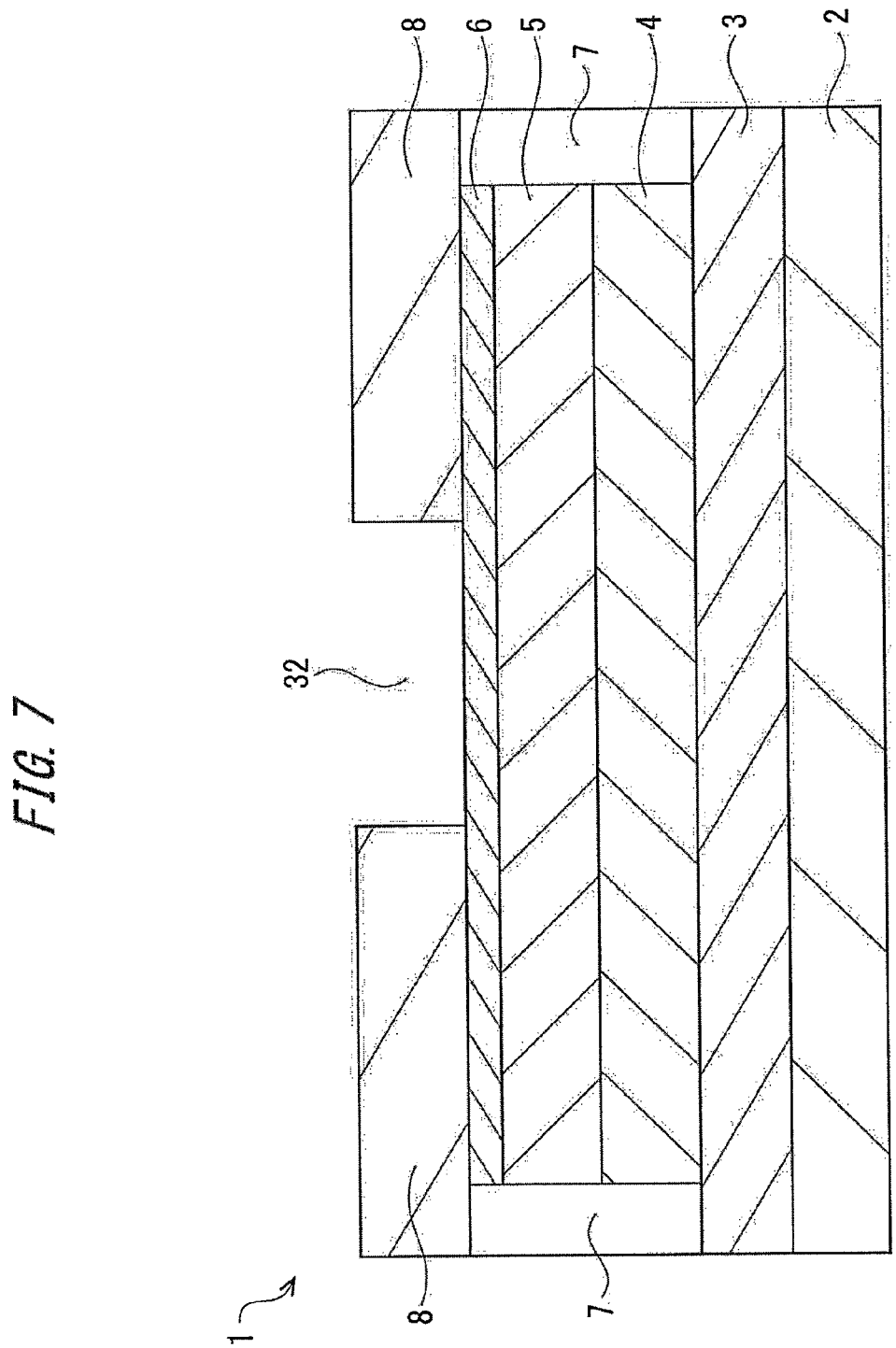
FIG. 7 is a view illustrating a process of removing the resist pattern 31 on the protection layer 8.

Then, by wet-etching the resist pattern 31 with a stripping solution such as SPM (sulfuric acid-hydrogen peroxide mixture), the resist pattern 31 on the protection layer 8 is removed, as illustrated in FIG. 7.

Here, in the processes illustrated in FIGS. 6 and 7, an example is illustrated in which the protection layer 8 is wet-etched with a liquid chemical such as HF and the resist pattern 31 is wet-etched with a stripping solution such as SPM. Without being limited to this example, the opening part 32, through which a part of the top surface of the cap layer 6 is exposed, may be formed in the protection layer 8 by dry-etching (anisotropic etching) the protection layer 8 with the resist pattern 31 being as a mask. The resist pattern 31 on the protection layer 8 may also be removed by ashing. When a wet-etching process is performed to the protection layer 8 and the resist pattern 31, damages to the exposed surface of the cap layer 6 exposing through the opening part 32 of the protection layer 8 (hereinafter, referred to as the exposed surface of the cap layer 6) are reduced. It is therefore preferable that a wet-etching process is performed to the protection layer 8 and the resist pattern 31.

Next, a natural oxidation film formed on the exposed surface of the cap layer 6 is removed by performing a cleaning process on the exposed surface of the cap layer 6 with a liquid chemical such as HF. The natural oxidation film is formed on the exposed surface of the cap layer 6, when the resist pattern 31 on the cap layer 6 is removed with a stripping solution such as SPM. Impurities may be included in the natural oxidation film formed on the exposed surface of the cap layer 6.

Figure 8:
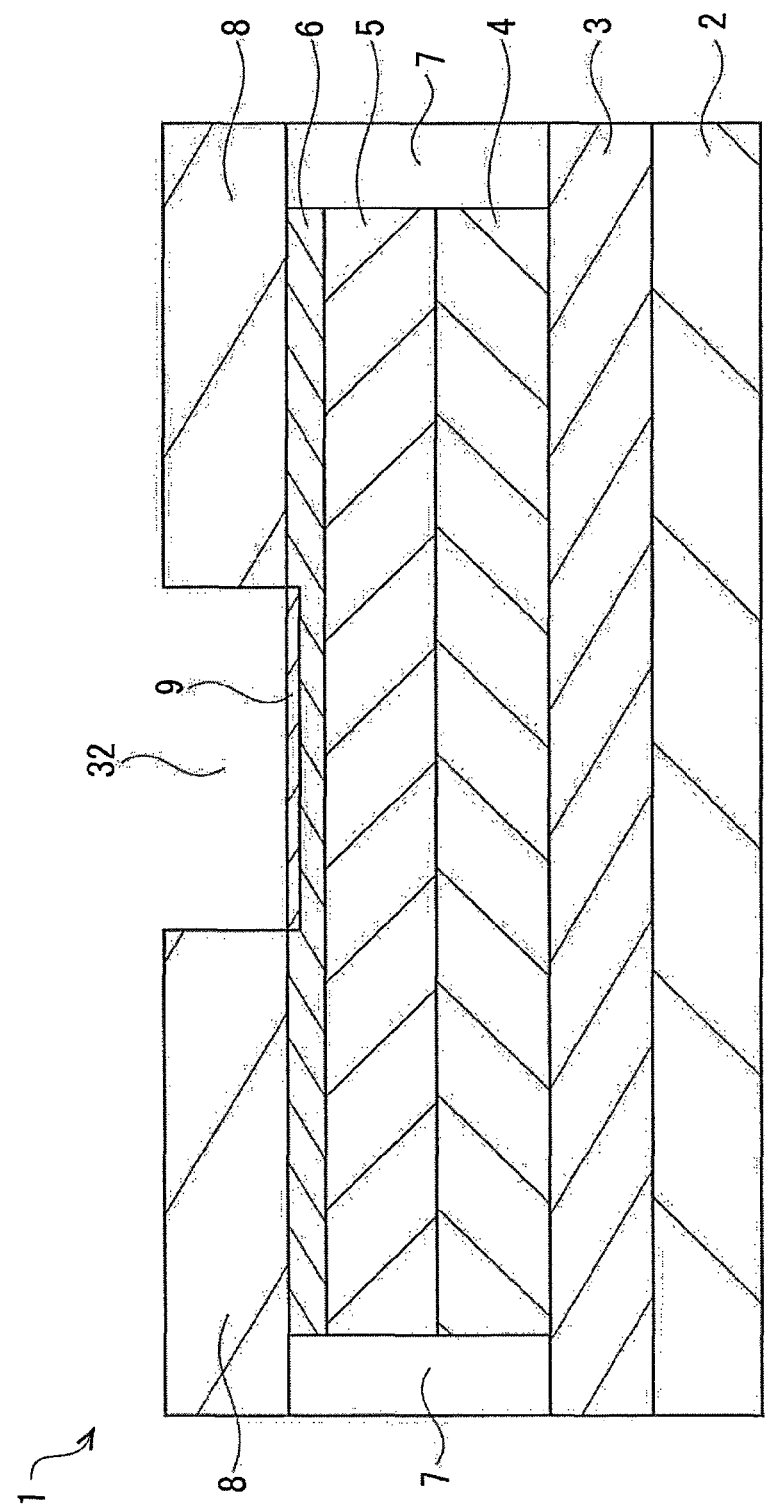
FIG. 8 is a view illustrating a process of forming an oxidation film 9 on the exposed surface of the cap layer 6.

Then, as illustrated in FIG. 8, the oxidation film 9 is formed on the exposed surface of the cap layer 6 by performing a wet process on the exposed surface of the cap layer 6 with a liquid chemical. The oxidation film 9 is a GaO (gallium oxide) film. The wet process may be performed to the exposed surface of the cap layer 6 with any one of APM (ammonia-hydrogen peroxide mixture), SPM, HPM (hydrochloric acid-hydrogen peroxide mixture) and $H_3PO_4$ (phosphoric acid), for example.

When any natural oxidation film is formed on the exposed surface of the cap layer 6, it becomes difficult to form the oxidation film 9 having uniform film quality on the exposed surface of the cap layer 6. As described above, the natural oxidation film formed on the exposed surface of the cap layer 6 is removed by performing the cleaning process on the exposed surface of the cap layer 6. Therefore, it is possible to form the oxidation film 9 having uniform film quality on the exposed surface of the cap layer 6.

Figure 9:
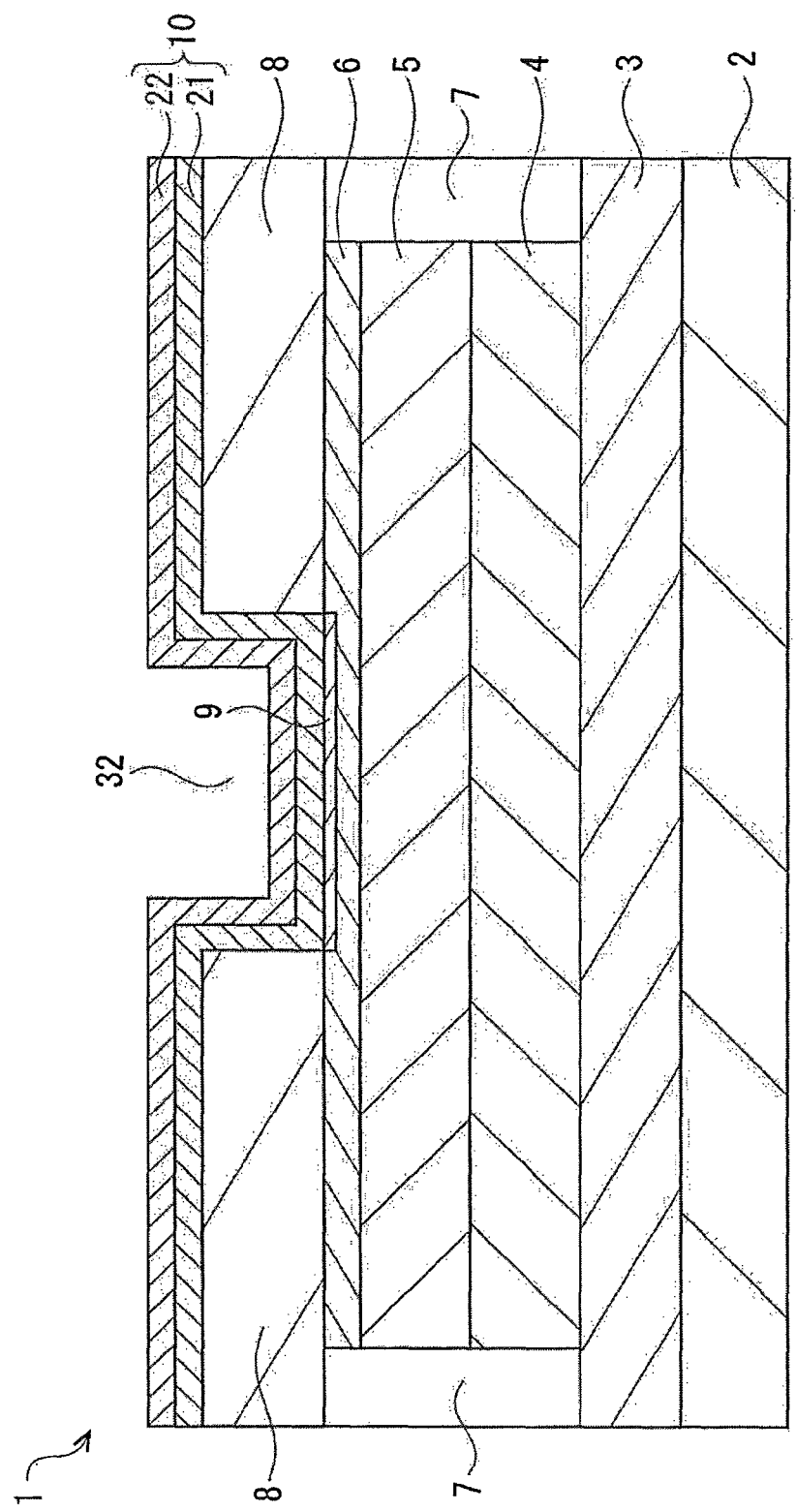
FIG. 9 is a view illustrating a process of forming a gate insulating film 10 on the protection layer 8 and in the opening part 32.

Next, as illustrated in FIG. 9, the gate insulating film 10 is formed on the protection layer 8 and in the opening part 32. In detail, the gate insulating film 10 is formed on the top surface and side surfaces of the protection layer 8, as well as on the oxidation film 9 formed on the exposed surface of the cap layer 6.

The gate insulating film 10 has a first gate insulating film 21 and a second gate insulating film 22. The first gate insulating film 21 is an AlN film, for example. For example, the AlN film having a thickness of more than or equal to 10 nm and less than or equal to 40 nm (for example, 20 nm) may be formed at a temperature of more than or equal to 380° C. and less than 430° C. (for example, 380° C.) by the ALD (Atomic Layer Deposition) technique. With use of the ALD technique, it is possible to form the AlN film having a superior step coverage. The AlN film may also be formed by the CVD technique, instead of the ALD technique. The second gate insulating film 22 is a SiN layer, for example. For example, the SiN layer having a thickness of more than or equal to 10 nm and less than or equal to 40 nm (for example, 20 nm) may be formed by the CVD technique. Here, in the first embodiment, formation of the second gate insulating film 22 may be omitted. Then, for the purpose of degassing, heat treatment is performed at a temperature of more than or equal to 500° C. and less than or equal to 700° C.

Figure 10:
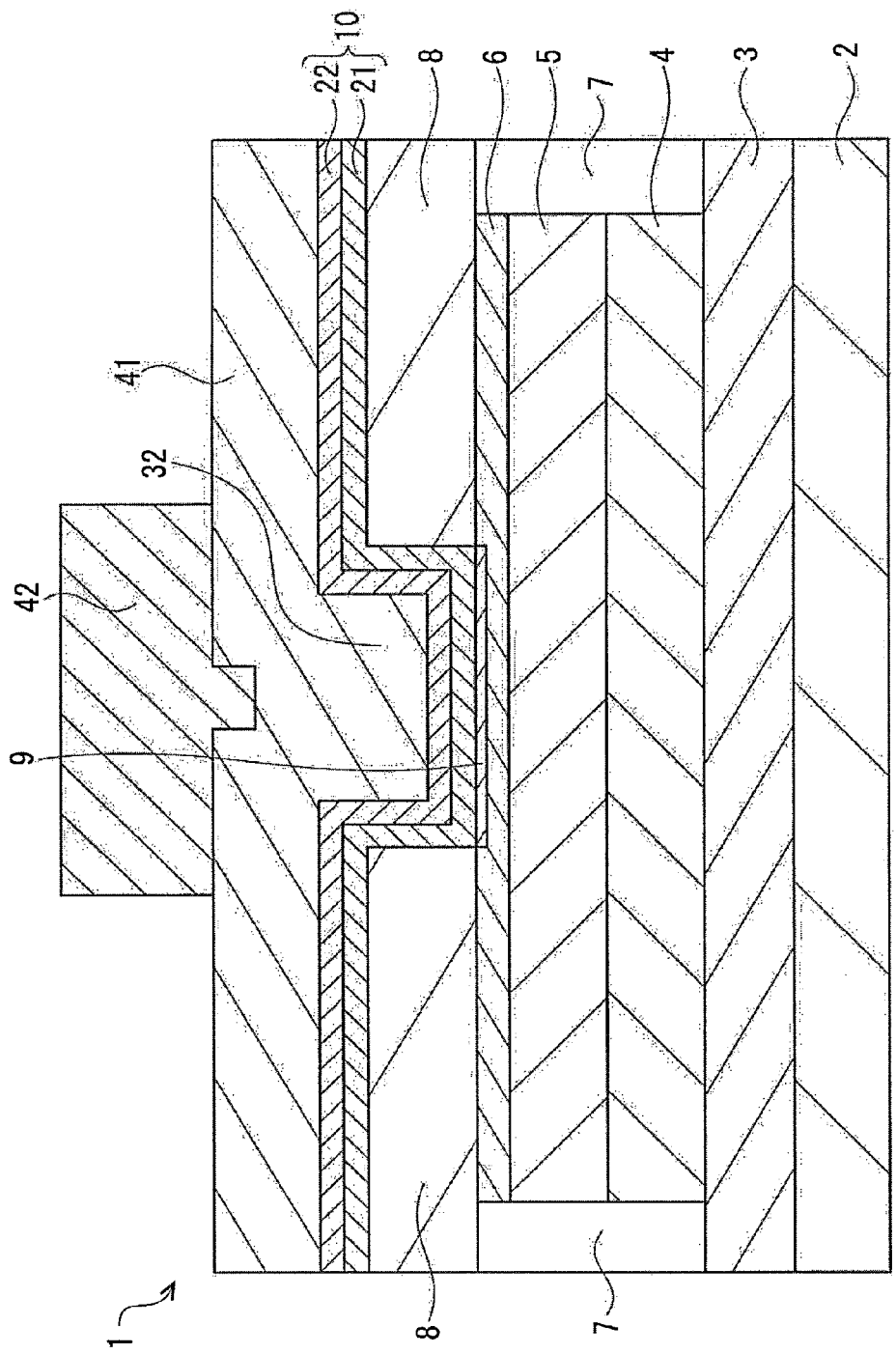
FIG. 10 is a view illustrating processes of forming a metal film 41 on the gate insulating film 10 and forming a resist pattern 42 on the metal film 41.

Next, as illustrated in FIG. 10, a metal film 41 is formed on the gate insulating film 10 by a vapor deposition technique. As illustrated in FIG. 10, the metal film 41 is embedded in the opening part 32. The metal film 41 may be a laminated film of Ti, TiN, TaN, Al or the like. For example, the metal film 41 may be formed on the gate insulating film 10 by forming a laminated film of TaN having a thickness of 50 nm and Al having a thickness of more than or equal to 200 nm and less than or equal to 400 nm (for example, 400 nm) by the vapor deposition technique.

Then, as illustrated in FIG. 10, the resist pattern 42 is formed on the metal film 41. For example, a resist is applied on the metal film 41 to form the resist pattern 42 by photolithography.

Figure 11:
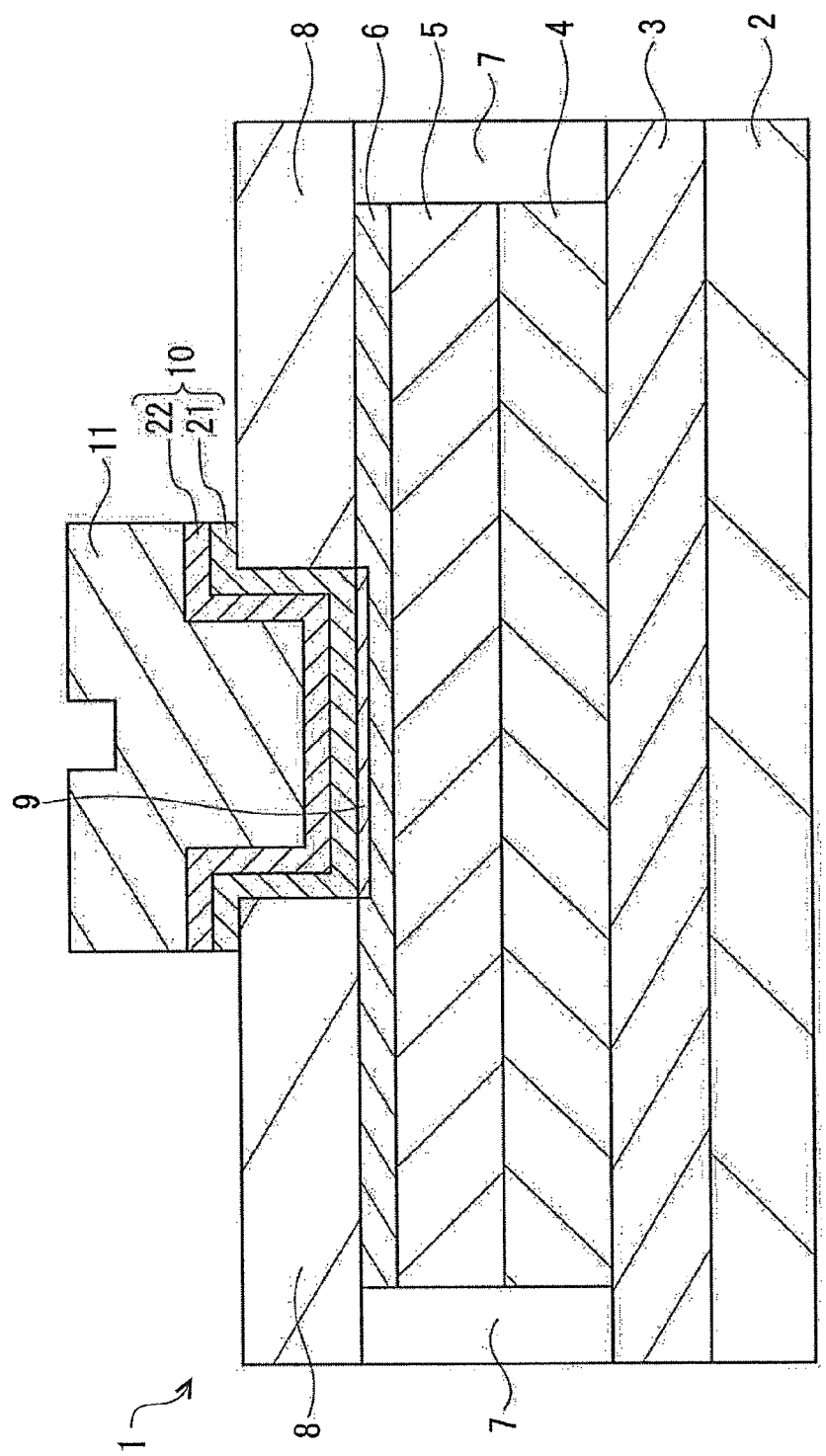
FIG. 11 is a view illustrating a process of forming a gate electrode 11 on the gate insulating film 10.

Next, dry-etching is performed with the resist pattern 42 being as a mask, so that the gate insulating film 10 and the metal film 41 are partly removed. As a result, the gate electrode 11 is formed on the gate insulating film 10, as illustrated in FIG. 11. The protection layer 8 functions as an etch stop layer for stopping the dry-etching. If any resist pattern 42 remains, the resist pattern 42 is removed. The resist pattern 42 may be removed with a stripping solution such as SPM or the resist pattern 42 may be removed by ashing.

Then, the passivation layer 12 is formed on the protection layer 8 and the gate electrode 11 by forming a SiO film having a thickness of more than or equal to 200 nm and less than or equal to 400 nm by the CVD technique, for example. The passivation layer 12 may also be formed on the protection layer 8 and the gate electrode 11 by forming a SiN film. Here, in the passivation layer 12, steps are formed between the part where the gate electrode 11 has been formed and the part where the gate electrode 11 has not been formed. In order to flatten the steps in the passivation layer 12, a spin-on-glass material film may be formed. The passivation layer 12 may also be flattened by the CMP (Chemical Mechanical Polishing) technique in order to flatten the steps in the passivation layer 12.

Figure 12:
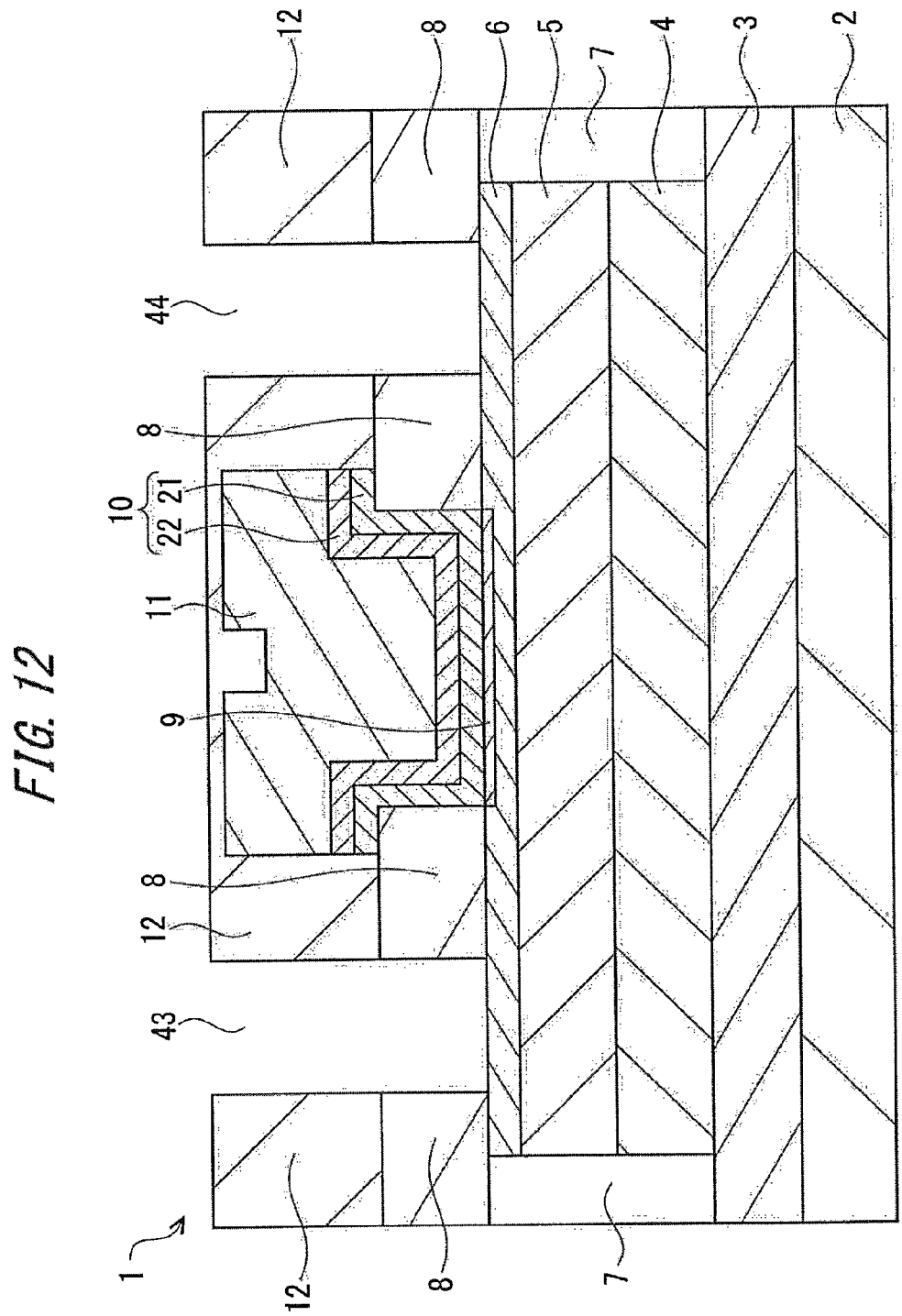
FIG. 12 is a view illustrating a process of forming contact holes 43, 44 in the protection layer 8 and a passivation layer 12.

Next, a resist pattern is formed on the passivation layer 12. Then, dry-etching is performed with the resist pattern formed on the passivation layer 12 being as a mask, so that the protection layer 8 and the passivation layer 12 are partly removed. By partly removing the protection layer 8 and the passivation layer 12, contact holes 43, 44 are formed in the protection layer 8 and the passivation layer 12, as illustrated in FIG. 12. If any resist pattern formed on the passivation layer 12 remains, the resist pattern is removed. The resist pattern may be removed with a stripping solution such as SPM or the resist pattern may be removed by ashing.

Then, Ti having a thickness of 25 nm and Al having a thickness of more than or equal to 200 nm and less than or equal to 400 nm (for example, 300 nm) are embedded in the contact holes 43, 44 by a vapor deposition technique. By embedding the Ti and Al in the contact hole 43, the source electrode 13 is formed in the contact hole 43. By embedding the Ti and Al in the contact hole 44, the drain electrode 14 is formed in the contact hole 44. By performing the above described processes, the semiconductor device 1 as illustrated in FIG. 1 is manufactured.

Second Embodiment

A semiconductor device 1 and a method for manufacturing the semiconductor device 1 according to a second embodiment will be described. In the second embodiment, a compound semiconductor element having a HEMT structure, which is one example of semiconductor device, will be described as an example. Differences between the first embodiment and the second embodiment are in that a recess (concave portion) 51 is formed in an electron supply layer 5 and a cap layer 6 and an oxidation film 9 is formed on the electron supply layer 5 and the cap layer 6. Therefore, the following description with respect to the second embodiment focuses on the above-described differences.

Figure 13:
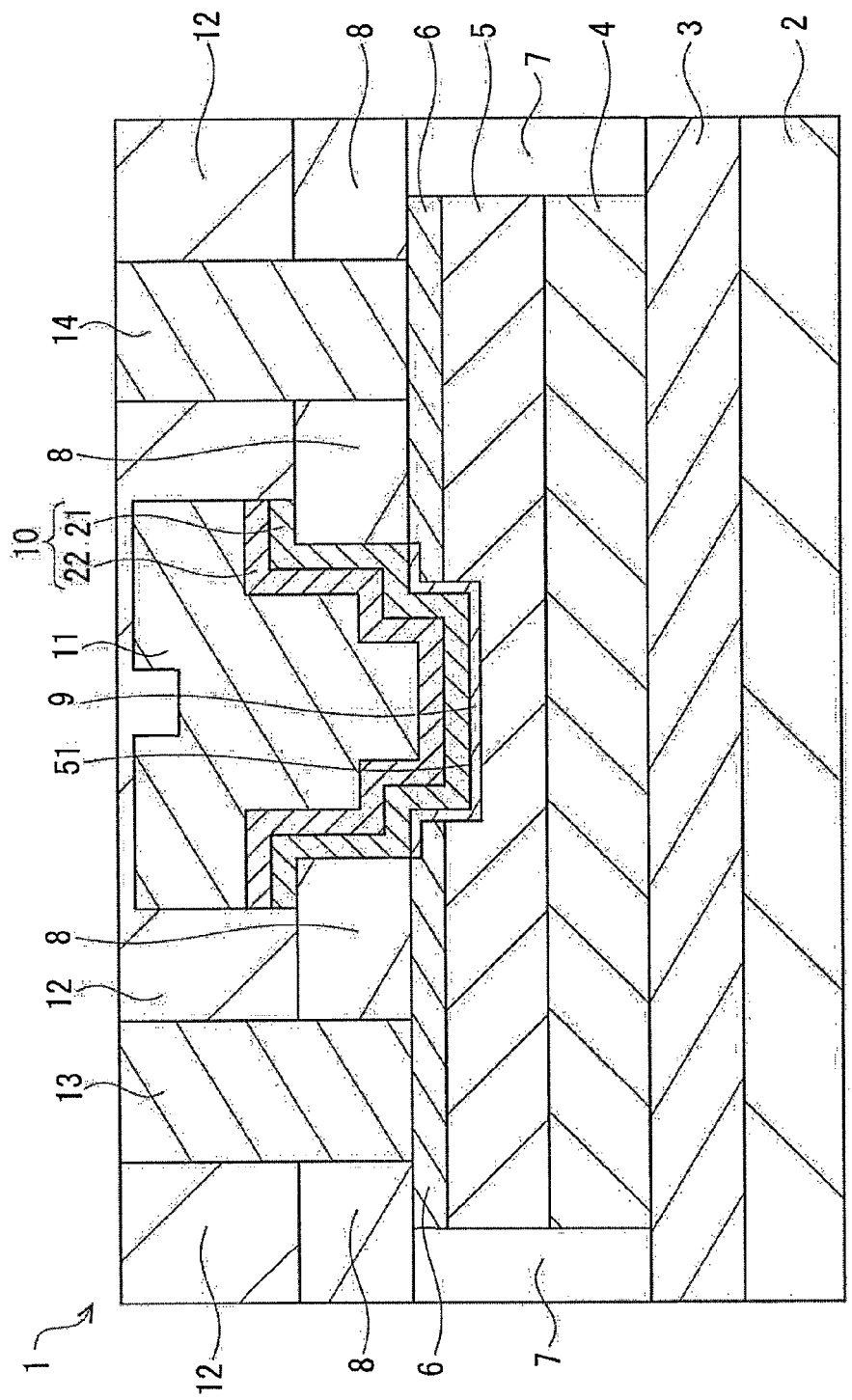
FIG. 13 is a cross-sectional view of the semiconductor device 1 according to a second embodiment.

FIG. 13 is a cross-sectional view of the semiconductor device 1 according to the second embodiment. The semiconductor device 1 includes a semiconductor substrate 2, a buffer layer 3, an electron transit layer 4, an electron supply layer 5, a cap layer 6, an element isolation region 7, a protection layer 8, an oxidation film 9, a gate insulating film 10, a gate electrode 11, a passivation layer 12, a source electrode 13 and a drain electrode 14.

The semiconductor substrate 2 is a Si substrate or a SiC substrate, for example. The buffer layer 3 is an AlxGa(1−x)N layer (wherein, x is more than zero and less than or equal to one), for example. Without being limited to the above-described layer, the buffer layer 3 may also be an AlN layer, an InGaN layer or a GaN layer. The buffer layer 3 has a function of enhancing the crystallinity of the electron transit layer 4. In the second embodiment, formation of the buffer layer 3 may be omitted.

The electron transit layer 4 is a GaN layer, for example. The electron transit layer 4 may also be an InGaN layer or an InAlGaN layer. The GaN layer may be an n-GaN layer which is doped with n-type impurities, or an undoped i-GaN layer. The InGaN layer may be an n-InGaN layer or an i-InGaN layer. The InAlGaN layer may be an n-InAlGaN layer or an i-InAlGaN layer.

The electron supply layer 5 is an n-Al(1−x)GaN (wherein, x=0.15 to 0.25) layer, for example. The cap layer 6 is an n-GaN layer or an i-GaN layer, for example. The electron supply layer 5 and the cap layer 6 have a recess 51 that penetrates through the cap layer 6 and reaches to the inside of the electron supply layer 5. The recess 51 is one example of a groove.

On the electron supply layer 5, the oxidation film 9 is formed in the part where the electron supply layer 5 and the gate insulating film 10 contact to each other. On the cap layer 6, the oxidation film 9 is formed in the part where the cap layer 6 and the gate insulating film 10 contact to each other. In other words, the electron supply layer 5 and the cap layer 6 have the oxidation film 9 at the interface between them and the gate insulating film 10. The gate insulating film 10 has a first gate insulating film 21 and a second gate insulating film 22. The first gate insulating film 21 is an AlN film, for example. The second gate insulating film 22 is a SiN (silicon nitride) film, for example. The passivation layer 12 is a SiO layer or a SiN layer, for example.

Figure 14:
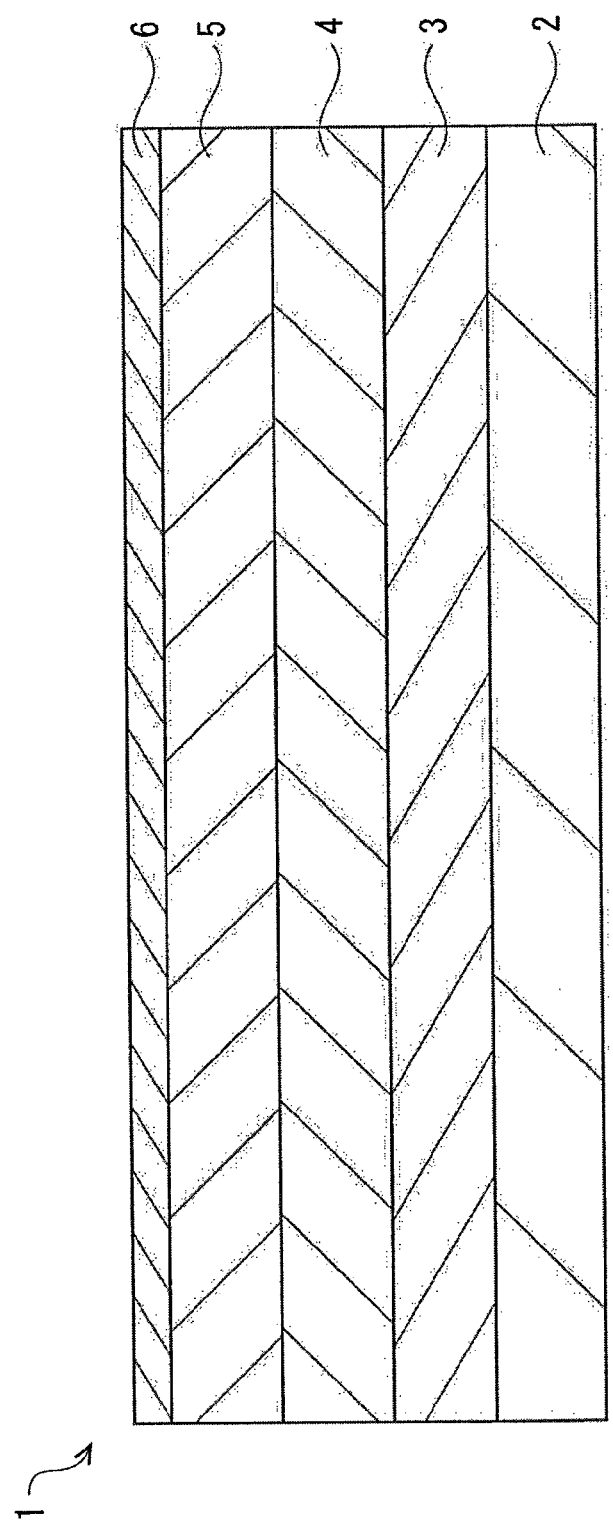
FIG. 14 is a view illustrating processes of forming the buffer layer 3, the electron transit layer 4, the electron supply layer 5 and the cap layer 6 on the semiconductor substrate 2.

The method for manufacturing the semiconductor device 1 according to the second embodiment will be described. In the method for manufacturing the semiconductor device 1 according to the second embodiment, at first, as illustrated in FIG. 14, the buffer layer 3 is formed on the semiconductor substrate 2 by the MOCVD technique or the MBE technique, for example. For example, the buffer layer 3 having a thickness of more than or equal to 1 μm and less than or equal to 3 μm (for example, 2.6 μm) is formed on the semiconductor substrate 2 by growing an AlGaN crystal on the semiconductor substrate 2.

Next, as illustrated in FIG. 14, the electron transit layer 4 is formed on the buffer layer 3 by the MOCVD technique or the MBE technique, for example. For example, the electron transit layer 4 having a thickness of more than or equal to 0.9 μm and less than or equal to 1.5 μm (for example, 1.1 μm) is formed on the buffer layer 3 by growing an i-GaN crystal on the buffer layer 3.

Then, as illustrated in FIG. 14, the electron supply layer 5 is formed on the electron transit layer 4 by the MOCVD technique or the MBE technique, for example. For example, the electron supply layer 5 having a thickness of more than or equal to 15 nm and less than or equal to 25 nm (for example, 20 nm) is formed on the electron transit layer 4 by growing an n-AlGaN (wherein, the composition ratio of Al is more than or equal to 15% and less than or equal to 20%) crystal on the electron transit layer 4.

Next, as illustrated in FIG. 14, the cap layer 6 is formed on the electron supply layer 5 by the MOCVD technique or the MBE technique, for example. For example, the cap layer 6 having a thickness of more than or equal to 2 nm and less than or equal to 5 nm (for example, 2 nm) is formed on the electron supply layer 5 by growing an n-GaN crystal on the electron supply layer 5.

Figure 15:
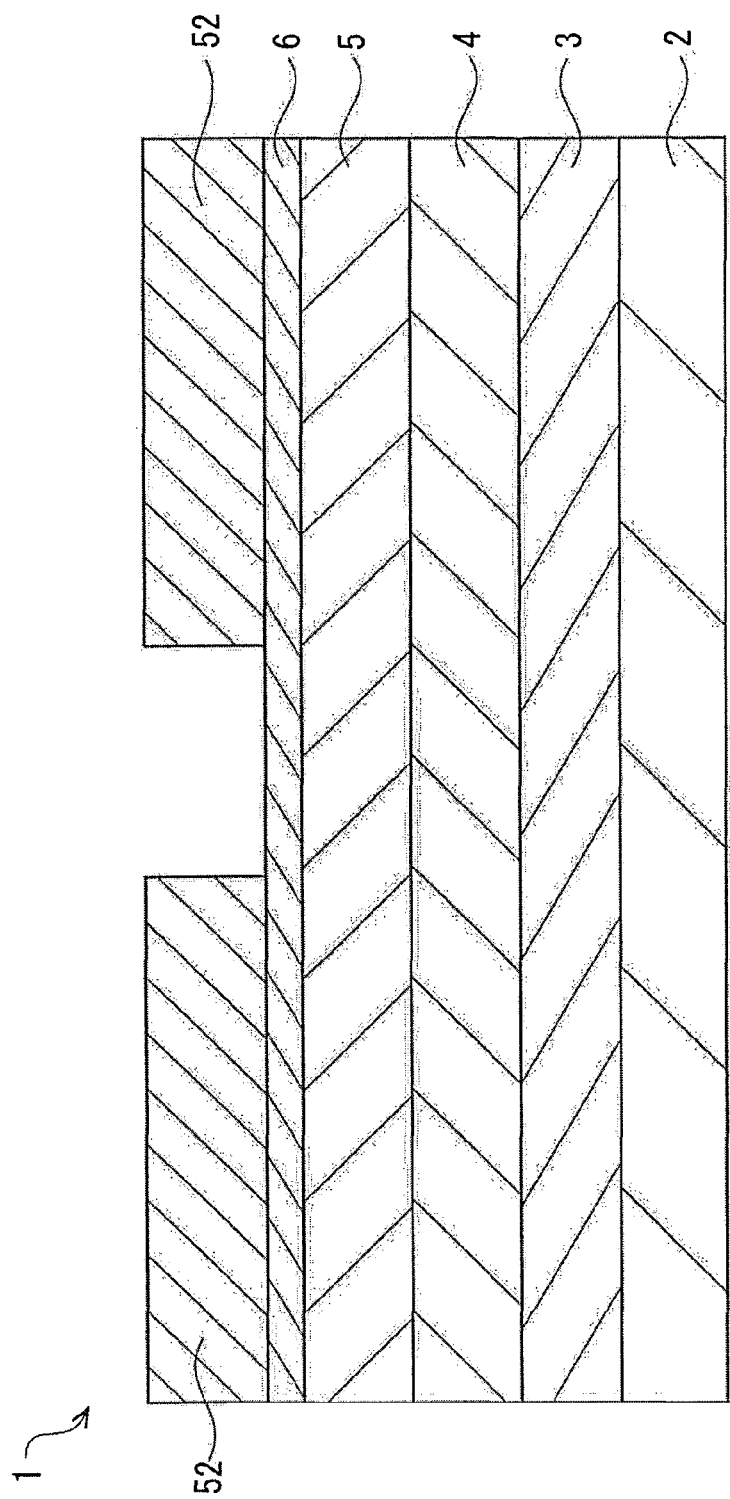
FIG. 15 is a view illustrating a process of forming a resist pattern 52 on the cap layer 6.

Then, as illustrated in FIG. 15, a resist pattern 52 with an opening in the predetermined region is formed on the cap layer 6. The predetermined region may be the region where the gate electrode 11 is formed or the region where a part of the gate electrode 11 is formed. For example, a resist is applied on the cap layer 6 to form the resist pattern 52 by photolithography.

Figure 16:
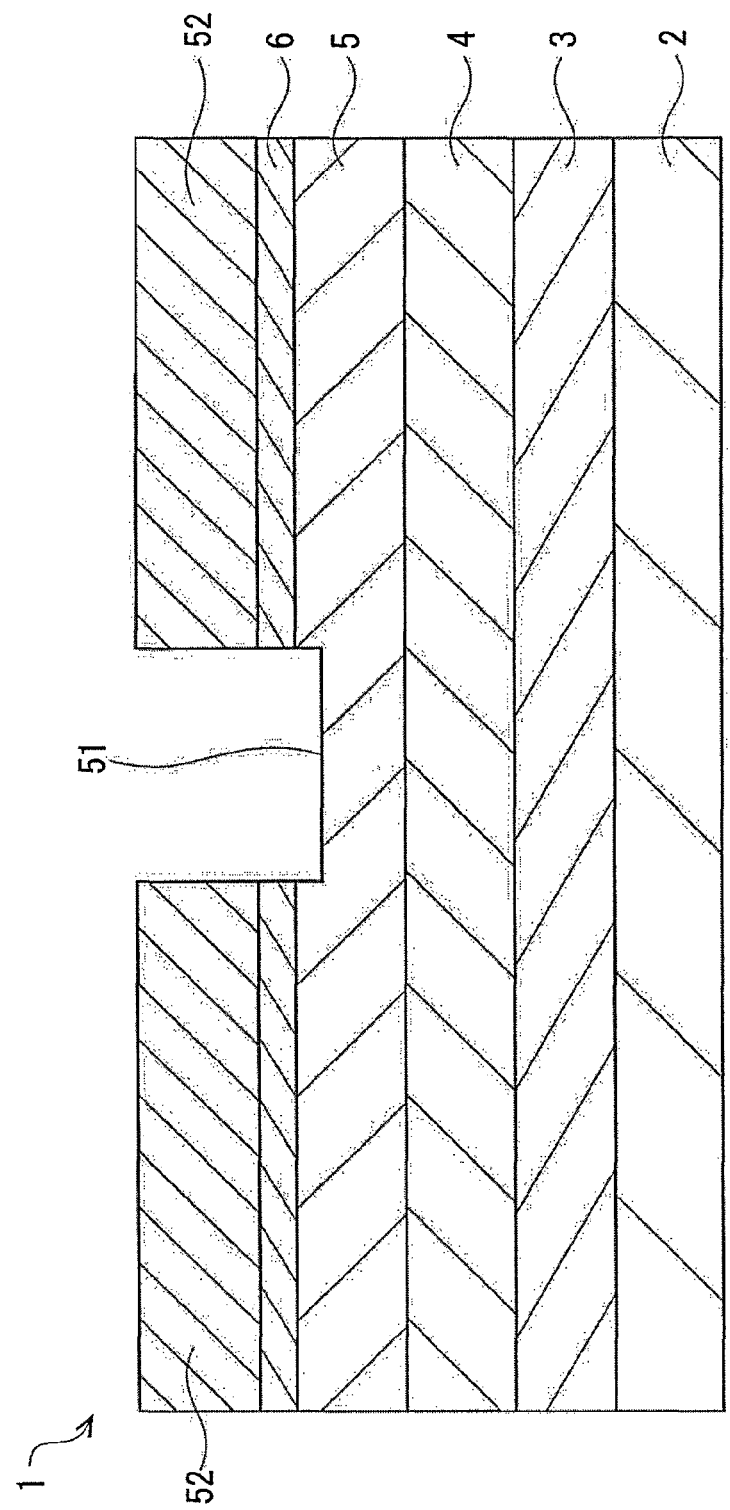
FIG. 16 is a view illustrating a process of forming a recess 51 in the electron supply layer 5 and the cap layer 6.

Next, dry-etching is performed with the resist pattern 52 being as a mask, so that the recess 51 is formed in the predetermined region of the electron supply layer 5 and the cap layer 6, as illustrated in FIG. 16. In the dry-etching, chlorine gases such as $Cl_2$ and $SF_x$ gases are used as etching gases, for example. The predetermined region of the electron supply layer 5 and the cap layer 6 may be the region where the gate electrode 11 is formed or the region where a part of the gate electrode 11 is formed. For example, the electron supply layer 5 and the cap layer 6 may be etched by the order of more than or equal to 15 nm and less than and equal to 20 nm in order to remain the order of more than or equal to 2 nm and less than and equal to 7 nm of the electron supply layer 5.

Then, the resist pattern 52 is removed. The resist pattern 52 may be removed with a stripping solution such as SPM or the resist pattern 52 may be removed by ashing.

Figure 17:
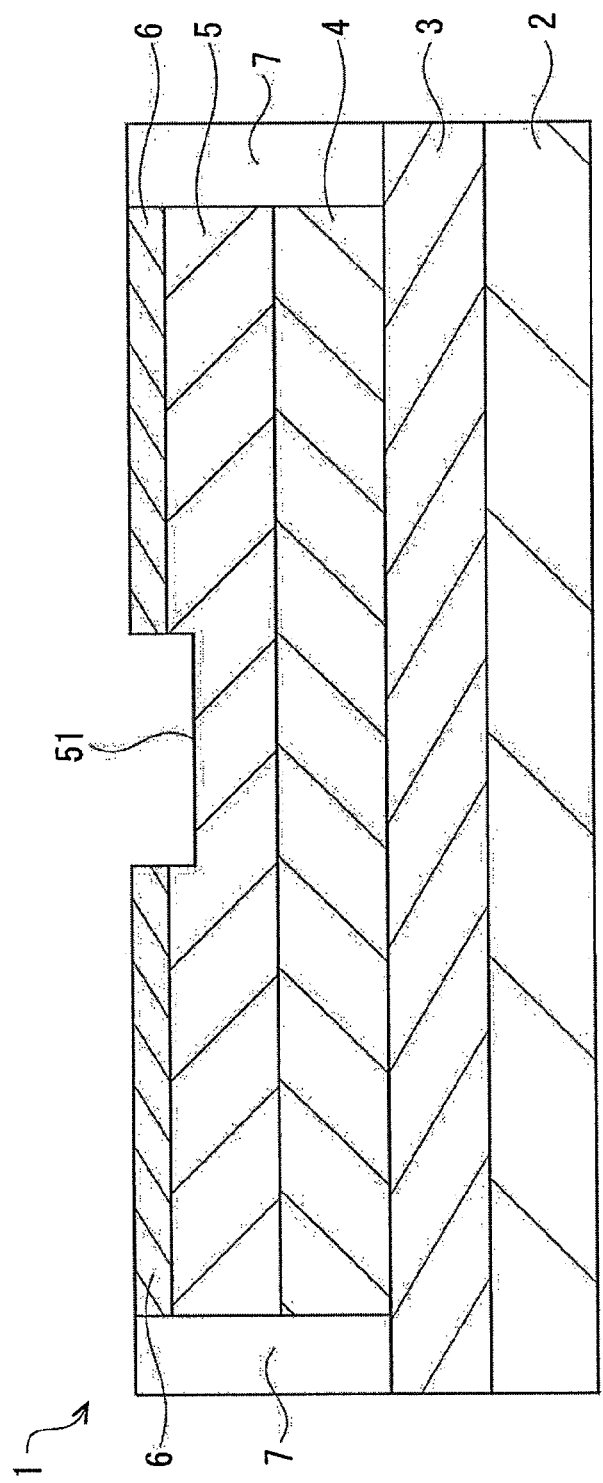
FIG. 17 is a view illustrating a process of forming the element isolation region 7 on the electron transit layer 4, the electron supply layer 5 and the cap layer 6.

Then, as illustrated in FIG. 17, the element isolation region 7 is formed in the electron transit layer 4, the electron supply layer 5 and the cap layer 6. For example, the element isolation region 7 is formed in the electron transit layer 4, the electron supply layer 5 and the cap layer 6, by performing ion implantation into the electron transit layer 4, the electron supply layer 5 and the cap layer 6 to break the crystal of the electron transit layer 4, the electron supply layer 5 and the cap layer 6. For example, ions may be continuously implanted under the following conditions.

Ion species: Ar, acceleration energy: 170 keV, dose: 5E13/$cm^2$

Ion species: Ar, acceleration energy: 100 keV, dose: 1E13/$cm^2$ B (boron) may also be used as ion species.

Figure 18:
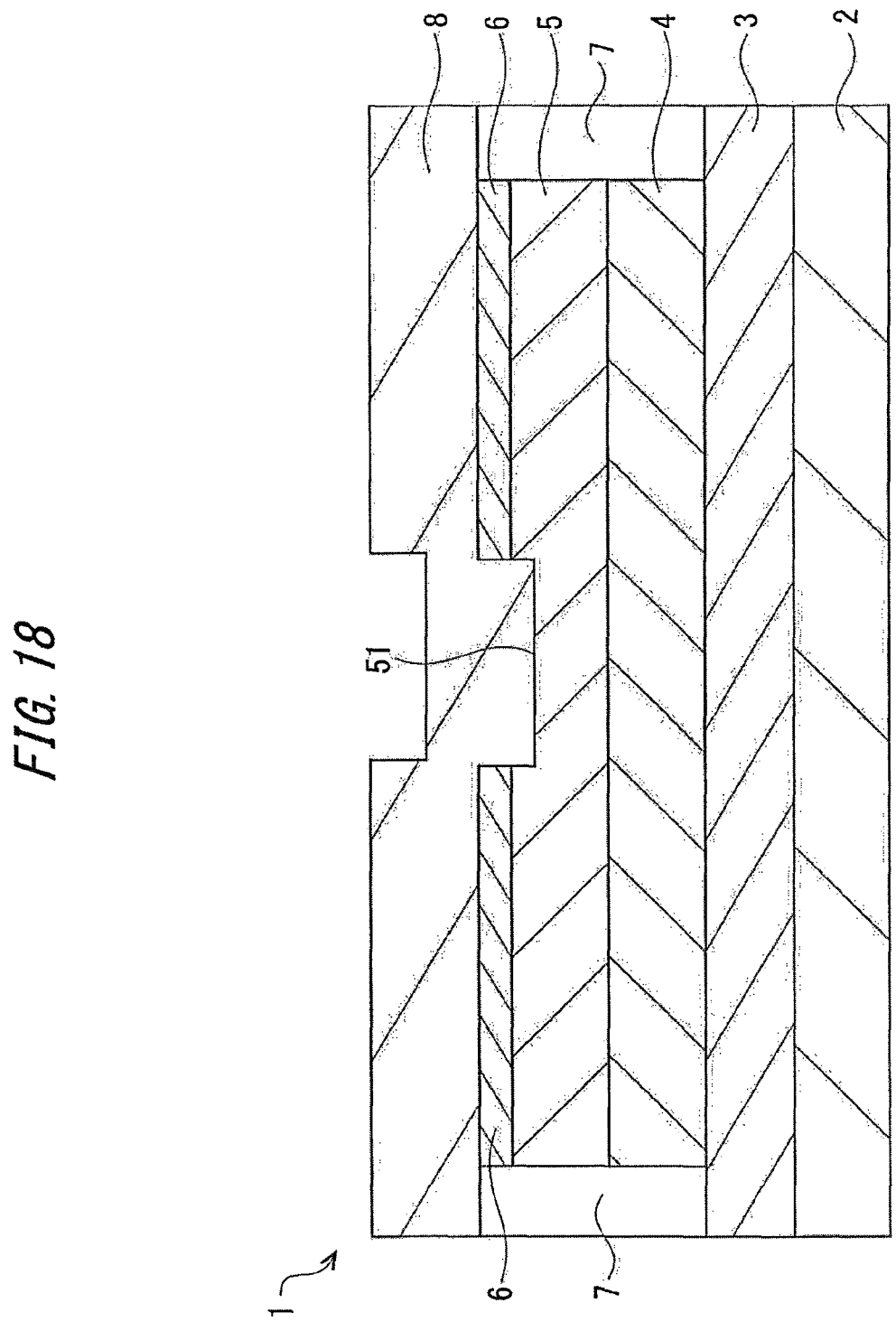
FIG. 18 is a view illustrating a process of forming a protection layer 8 on the cap layer 6 and on the electron supply layer 5 in the recess 51.

Then, as illustrated in FIG. 18, the protection layer 8, which is an insulating layer, is formed on the cap layer 6 and the electron supply layer 5 in the recess 51. For example, the protection layer 8 is formed on the cap layer 6 and the electron supply layer 5 in the recess 51 by forming a SiN film having a thickness of more than or equal to 200 nm and less than or equal to 300 nm on the cap layer 6 and the electron supply layer 5 in the recess 51 by the CVD technique.

Figure 19:
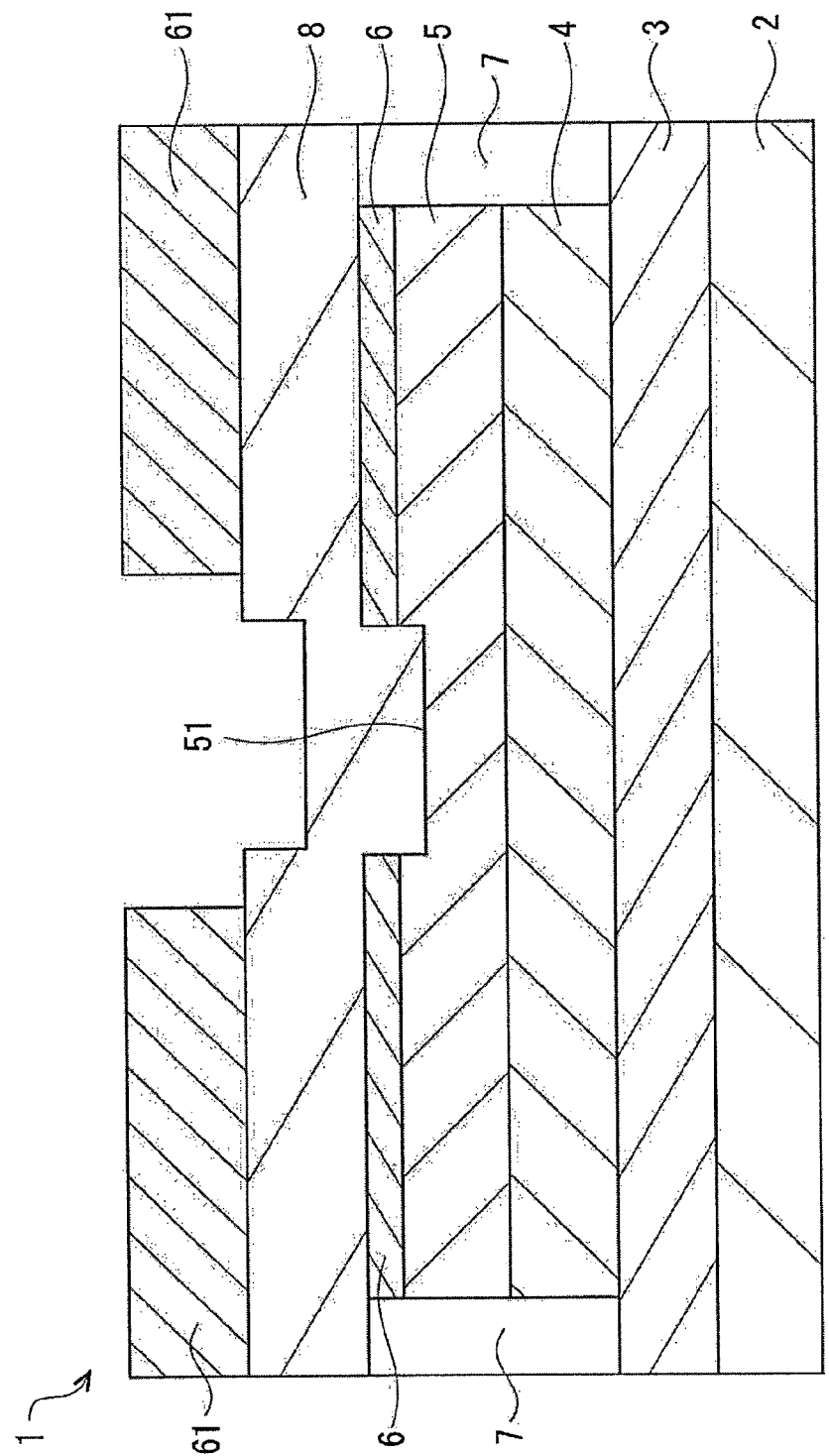
FIG. 19 is a view illustrating a process of forming a resist pattern 61 on the protection layer 8.

Then, as illustrated in FIG. 19, a resist pattern 61 with an opening in the predetermined region is formed on the protection layer 8. The predetermined region may be the region where the gate electrode 11 is formed or the region where a part of the gate electrode 11 is formed. For example, a resist is applied on the protection layer 8 to form the resist pattern 61 by photolithography.

Figure 20:
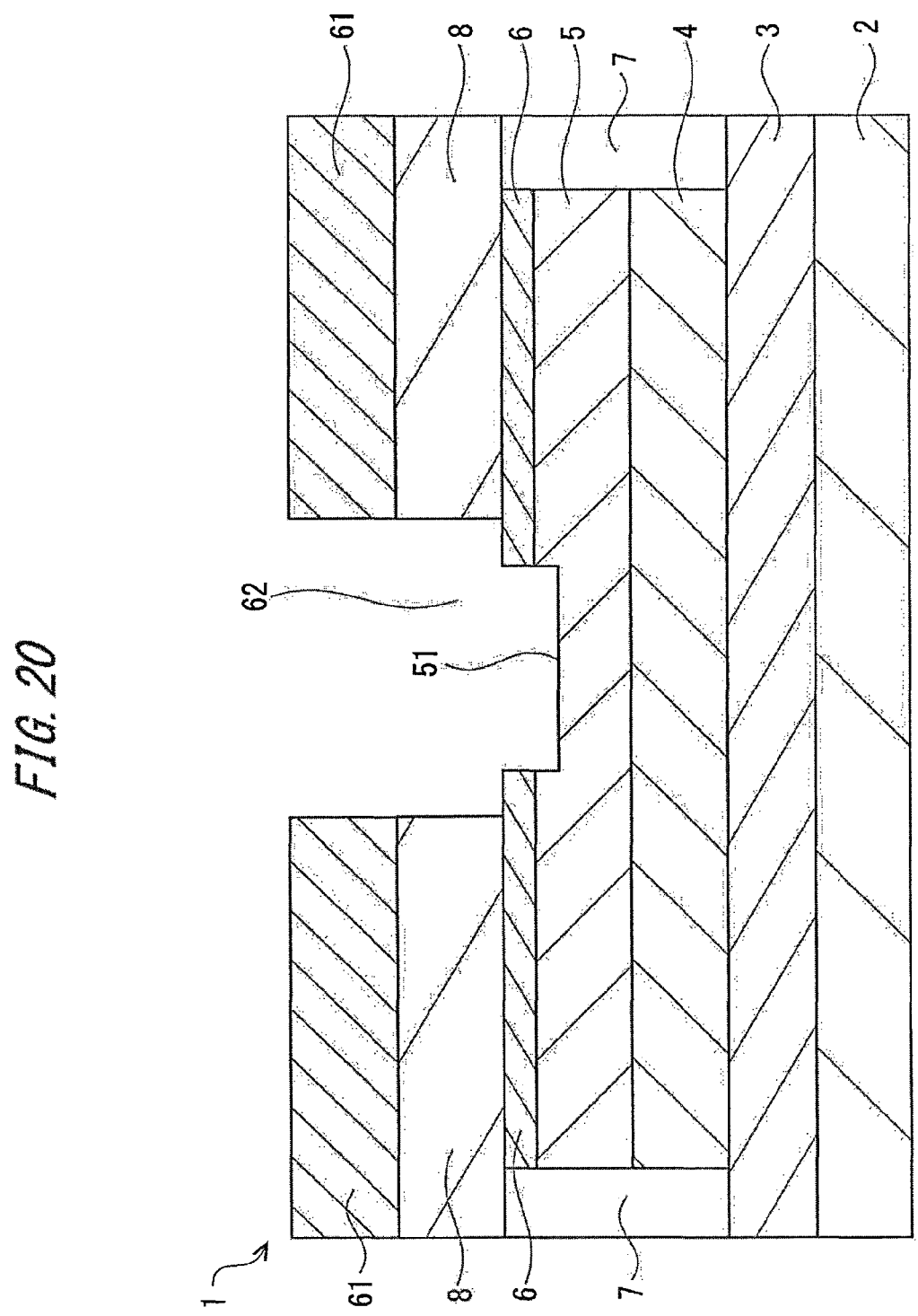
FIG. 20 is a view illustrating a process of forming an opening part 62 in the protection layer 8.

Next, as illustrated in FIG. 20, by wet-etching the protection layer 8 with a liquid chemical such as HF with the resist pattern 61 being as a mask, an opening part 62 is formed in the protection layer 8, through which the electron supply layer 5 and the cap layer 6 in the recess 51 are exposed. In other words, the opening part 62, through which a part of the electron supply layer 5 and the cap layer 6 are exposed, is formed in the protection layer 8. As a result of the processes illustrated in FIGS. 18-20, the protection layer 8 having the opening part 62, through which the recess 51 is exposed, is formed on the cap layer 6.

Figure 21:
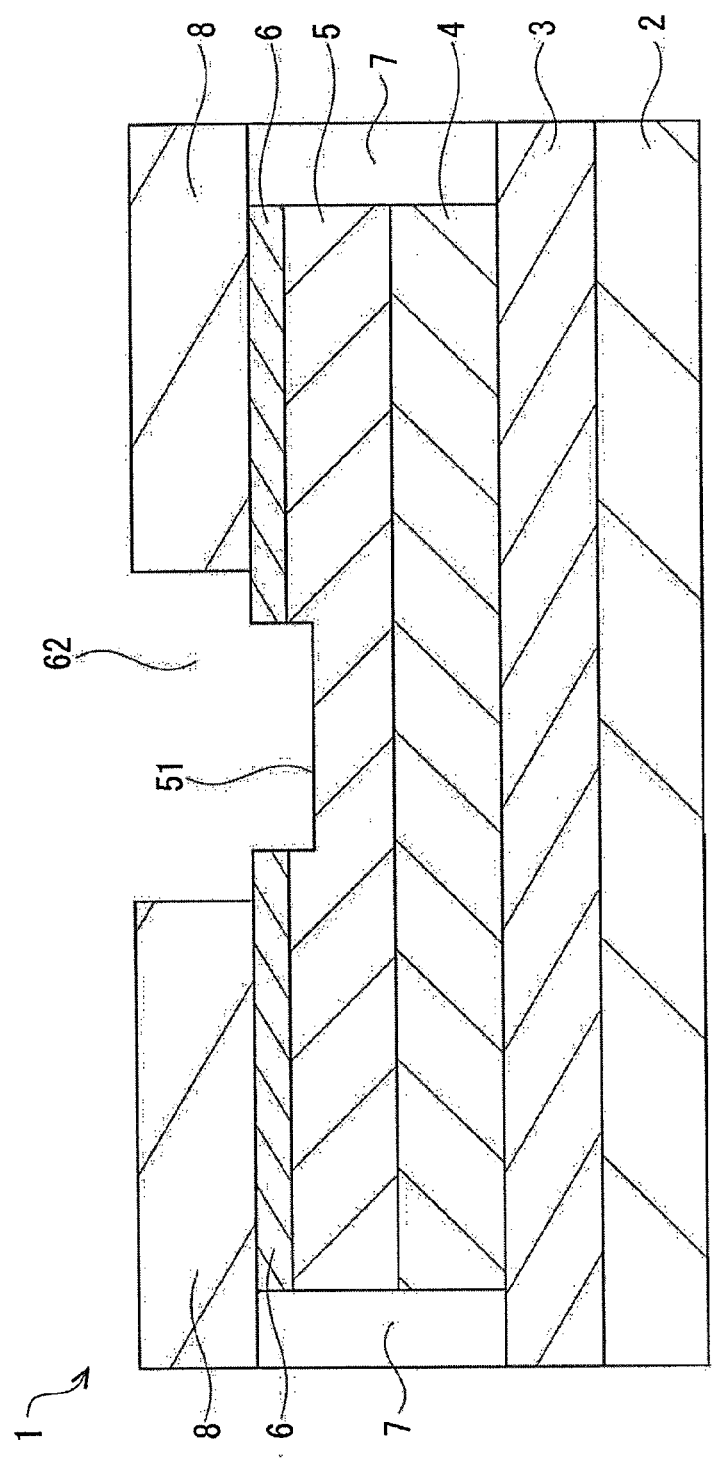
FIG. 21 is a view illustrating a process of removing the resist pattern 61 on the protection layer 8.

Then, by wet-etching the resist pattern 61 with a stripping solution such as SPM, the resist pattern 61 on the protection layer 8 is removed, as illustrated in FIG. 21.

Here, in the processes illustrated in FIGS. 20 and 21, an example is illustrated in which the protection layer 8 is wet-etched with a liquid chemical such as HF and the resist pattern 61 is wet-etched with a stripping solution such as SPM. Without being limited to this example, the opening part 62, through which the electron supply layer 5 and the cap layer 6 in the recess 51 are exposed, may be formed in the protection layer 8 by dry-etching the protection layer 8 with the resist pattern 61 being as a mask. The resist pattern 61 on the protection layer 8 may also be removed by asking. If a wet-etching process is performed to the protection layer 8 and the resist pattern 61, damages to the exposed surfaces of the electron supply layer 5 and the cap layer 6 in the recess 51 exposing through the opening part 62 of the protection layer 8 (hereinafter, referred to as the exposed surfaces of the electron supply layer 5 and the cap layer 6 in the recess 51) are reduced. It is therefore preferable that a wet-etching process is performed to the protection layer 8 and the resist pattern 61.

Next, a natural oxidation film formed on the exposed surfaces of the electron supply layer 5 and the cap layer 6 in the recess 51 is removed by performing a cleaning process on the exposed surfaces of the electron supply layer 5 and the cap layer 6 in the recess 51 with a liquid chemical such as HF. The natural oxidation film is formed on the exposed surfaces of the electron supply layer 5 and the cap layer 6 in the recess 51, when the resist pattern 61 on the cap layer 6 is removed with a stripping solution such as SPM. Impurities may be included in the natural oxidation film formed on the exposed surfaces of the electron supply layer 5 and the cap layer 6 in the recess 51.

Figure 22:
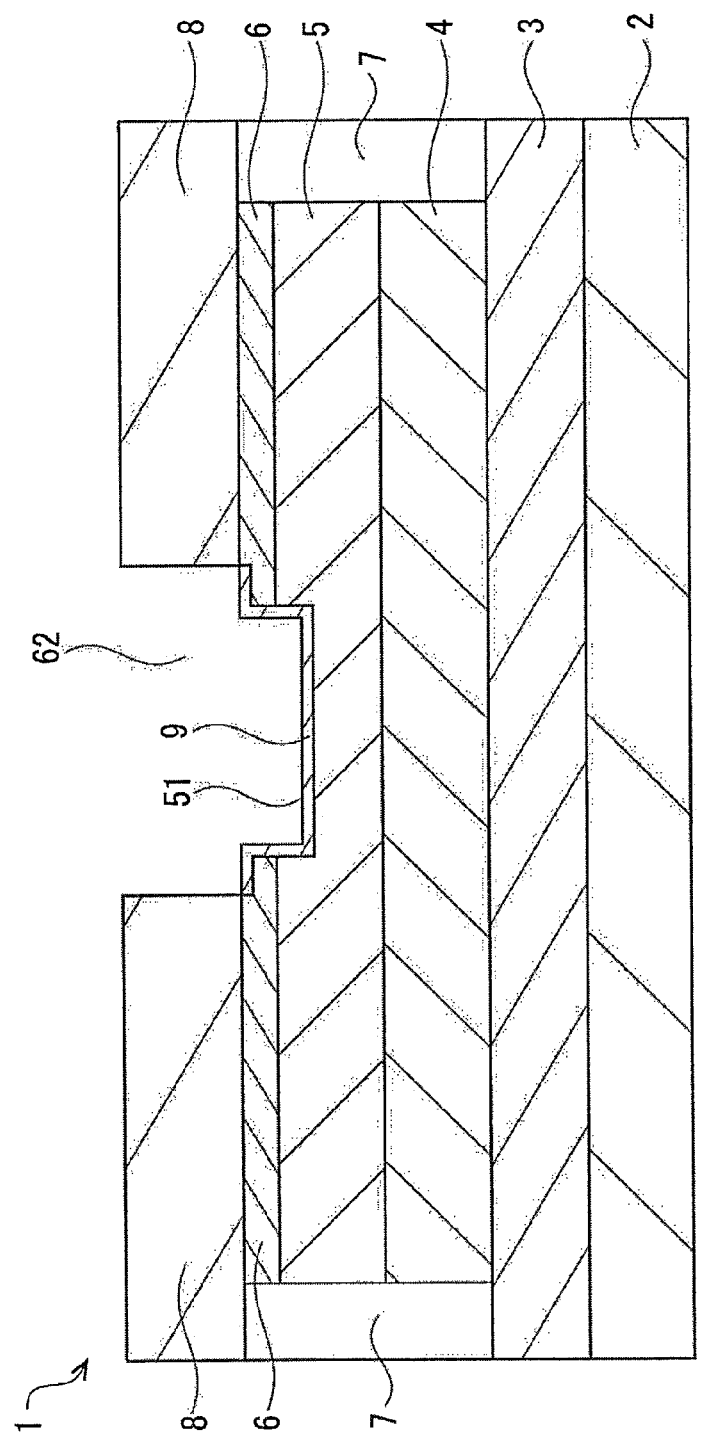
FIG. 22 is a view illustrating a process of forming the oxidation film 9 on the exposed surfaces of the electron supply layer 5 and the cap layer 6.

Then, as illustrated in FIG. 22, the oxidation film 9 is formed on the exposed surfaces of the electron supply layer 5 and the cap layer 6 in the recess 51 by performing a wet process on the exposed surfaces of the electron supply layer 5 and the cap layer 6 in the recess 51 with a liquid chemical. The oxidation film 9 is a GaO film. The wet process may be performed to the exposed surfaces of the electron supply layer 5 and the cap layer 6 in the recess 51 with any one of APM, SPM, HPM and $H_3PO_4$, for example.

If any natural oxidation film has been formed on the exposed surfaces of the electron supply layer 5 and the cap layer 6 in the recess 51, it is difficult to form the oxidation film 9 having uniform film quality on the exposed surfaces of the electron supply layer 5 and the cap layer 6 in the recess 51. As described above, the natural oxidation film formed on the exposed surfaces of the electron supply layer 5 and the cap layer 6 in the recess 51 is removed by performing the cleaning process on the exposed surfaces of the electron supply layer 5 and the cap layer 6 in the recess 51. Therefore, it is possible to form the oxidation film 9 having uniform film quality on the exposed surfaces of the electron supply layer 5 and the cap layer 6 in the recess 51.

Figure 23:
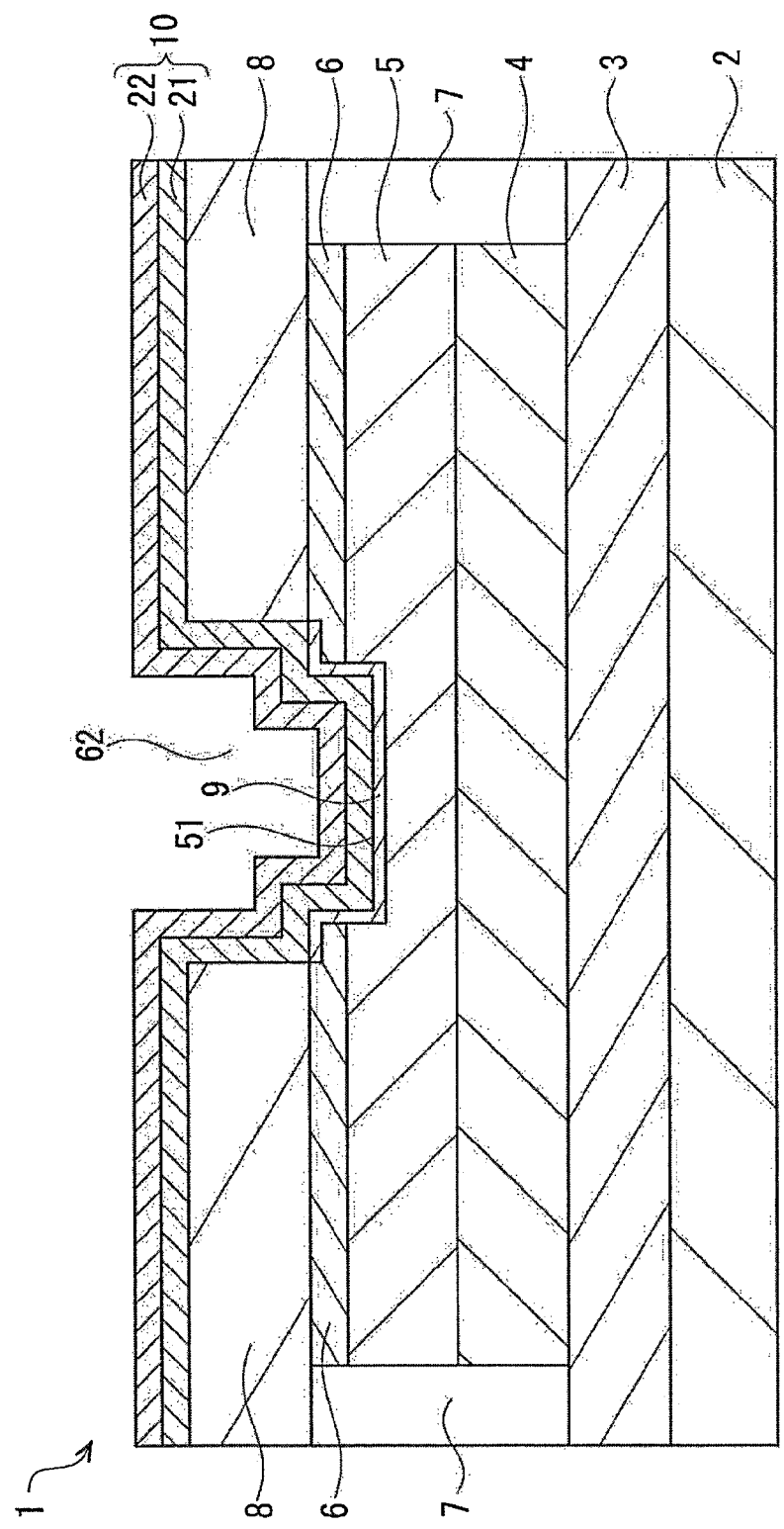
FIG. 23 is a view illustrating a process of forming the gate insulating film 10 on the protection layer 8 and in the opening part 62.

Next, as illustrated in FIG. 23, the gate insulating film 10 is formed on the protection layer 8 and in the opening part 62. In detail, the gate insulating film 10 is formed on the top surface and side surfaces of the protection layer 8, as well as on the oxidation film 9 formed on the exposed surfaces of the electron supply layer 5 and the cap layer 6 in the recess 51.

The gate insulating film 10 has a first gate insulating film 21 and a second gate insulating film 22. The first gate insulating film 21 is an AlN film, for example. For example, the AlN film having a thickness of more than or equal to 10 nm and less than or equal to 40 nm (for example, 20 nm) may be formed at a temperature of more than or equal to 380° C. and less than 430° C. (for example, 380° C.) by the ALD technique. With use of the ALD technique, it is possible to form the AlN film having a superior step coverage. The AlN film may also be formed by the CVD technique, instead of the ALD technique. The second gate insulating film 22 is a SiN layer, for example. For example, the SiN layer having a thickness of more than or equal to 10 nm and less than or equal to 40 nm (for example, 20 nm) may be formed by the CVD technique. Here, in the second embodiment, formation of the second gate insulating film 22 may be omitted. Then, for the purpose of degassing, heat treatment is performed at a temperature of more than or equal to 500° C. and less than or equal to 700° C.

After performing the process of forming the gate insulating film 10, processes of forming the gate electrode 11, the passivation layer 12, the source electrode 13 and the drain electrode 14 are performed in the same way as in the first embodiment, to manufacture the semiconductor device 1 as illustrated in FIG. 13.

Figure 24:
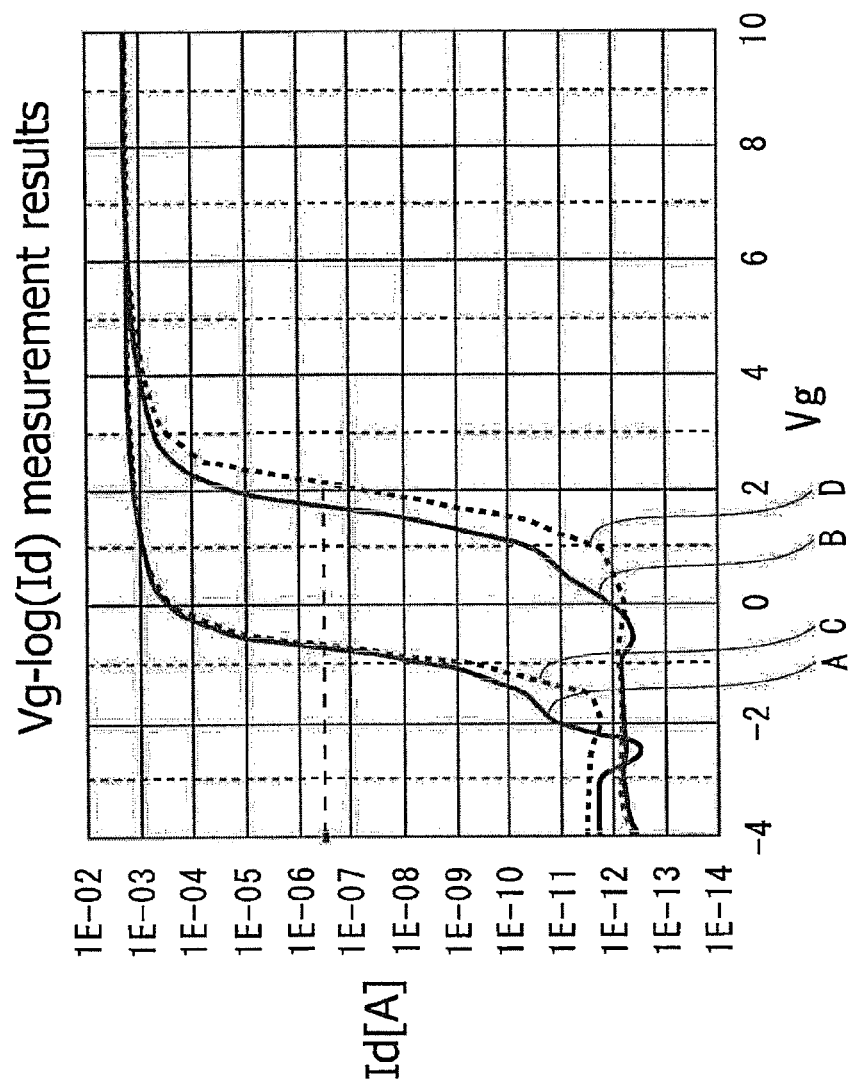
FIG. 24 is a view illustrating measurement results of Id-Vg characteristics of the semiconductor device 1 according to the second embodiment and measurement results of Id-Vg characteristics of a semiconductor device according to a comparative example.
Figure 25:
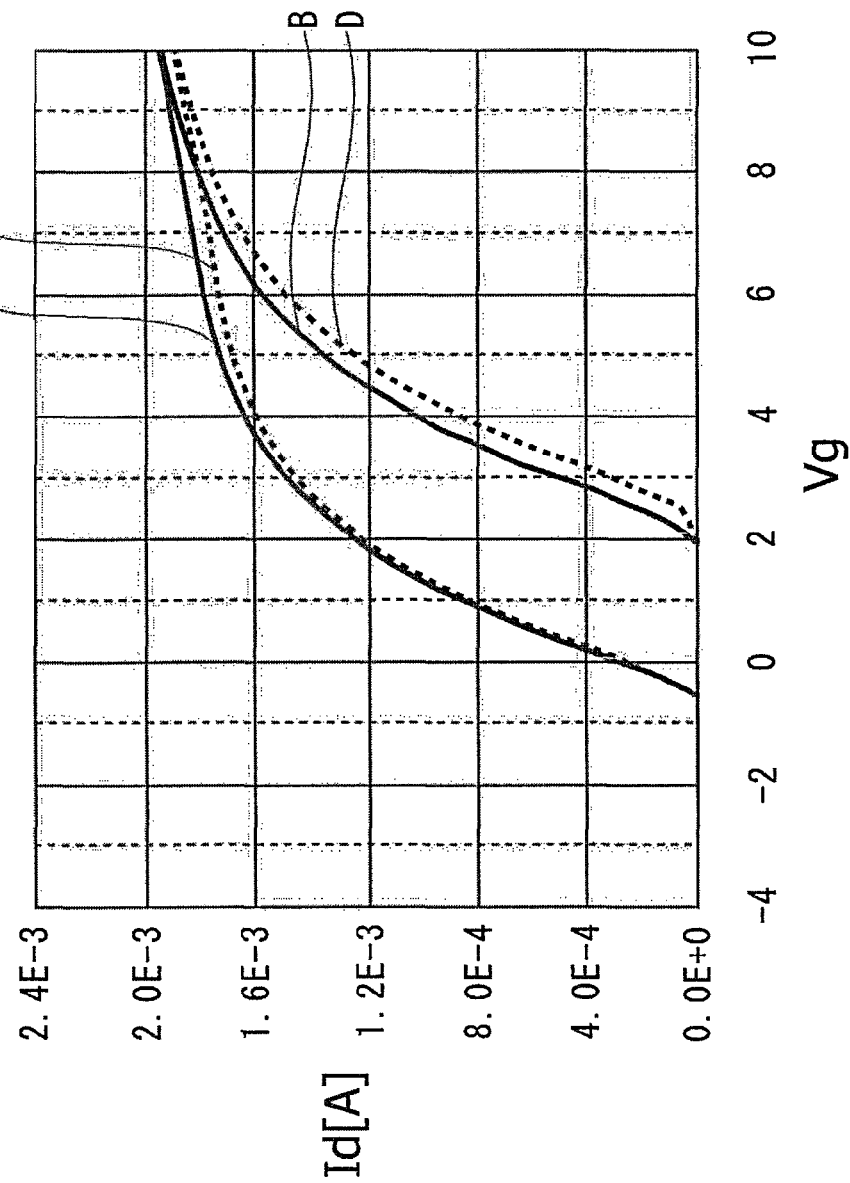
FIG. 25 is a view illustrating measurement results of Id-Vg characteristics of a linear region of the semiconductor device 1 according to the second embodiment and measurement results of Id-Vg characteristics of a linear region of the semiconductor device according to the comparative example.

In FIG. 24, measurement results of Id-Vg characteristics of the semiconductor device 1 according to the second embodiment and measurement results of Id-Vg characteristics of a semiconductor device according to a comparative example are illustrated. In FIG. 25, measurement results of Id-Vg characteristics in a linear region of the semiconductor device 1 according to the second embodiment and measurement results of Id-Vg characteristics in a linear region of a semiconductor device according to a comparative example are illustrated. The vertical axes in FIGS. 24 and 25 are drain current (Id [A]) and the abscissa axes in FIGS. 24 and 25 are gate voltage (Vg). The semiconductor device according to the comparative example is manufactured without a wet process with a liquid chemical on the exposed surface of the electron supply layer 5 and the cap layer 6 in the recess 51. In other words, in the semiconductor device according to the comparative example, any oxidation film 9 is not formed on the electron supply layer 5 and the cap layer 6 in the recess 51.

With respect to the semiconductor device 1 according to the second embodiment, an Id-Vg wave (Forward) of the drain current when the gate voltage is changed from −4V to +10V is designated by the solid line A. With respect to the semiconductor device 1 according to the second embodiment, an Id-Vg wave (Reverse) of the drain current when the gate voltage is changed from +10V to −4V is designated by the solid line B. With respect to the semiconductor device according to the comparative example, an Id-Vg wave (Forward) of the drain current when the gate voltage is changed from −4V to +10V is designated by the dashed line C. With respect to the semiconductor device according to the comparative example, an Id-Vg wave (Reverse) of the drain current when the gate voltage is changed from +10V to −4V is designated by the dashed line D.

As illustrated in FIGS. 24 and 25, with respect to the Id-Vg characteristics the semiconductor device 1 according to the second embodiment and the semiconductor device according to the comparative example, a hysteresis with different drain current value is generated during increase in the gate voltage than that during decrease in the gate voltage.

Figure 26:
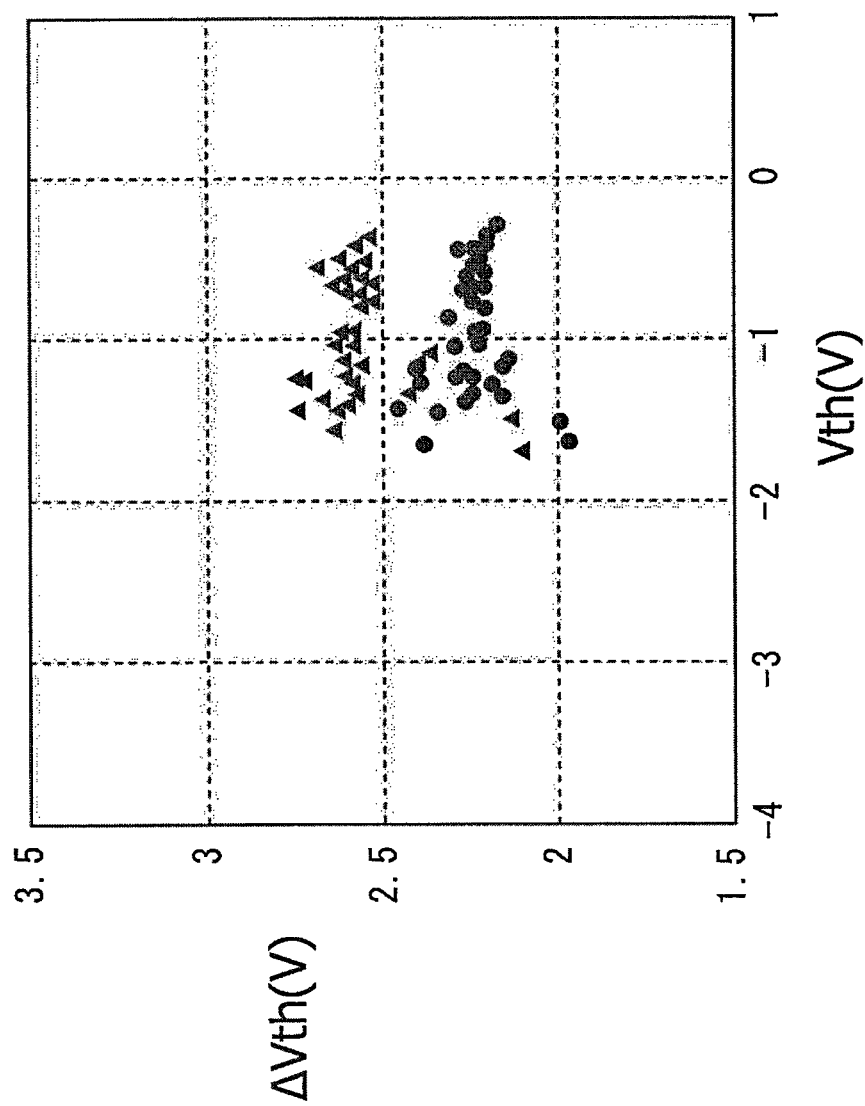
FIG. 26 is a view illustrating the relation between Vth of Id-Vg waves (Forward) and ΔVth.

Herein, the gate voltage in the case where the drain current illustrated in FIG. 24 is 0.5 μA is defined as Vth and the difference between Vth of the Id-Vg wave (Forward) and Vth of the Id-Vg wave (Reverse) is defined as ΔVth. FIG. 26 is a view illustrating the relation between Vth of the Id-Vg wave (Forward) and ΔVth. The vertical axis in FIG. 26 is ΔVth(V) and the abscissa axis in FIG. 26 is Vth(V) of the Id-Vg wave (Forward). In FIG. 26, ΔVth values with respect to the semiconductor device 1 according to the second embodiment are illustrated with black circles, while ΔVth values with respect to the semiconductor device according to the comparative example are illustrated with black triangles. In FIG. 26, with respect to the semiconductor device 1 according to the second embodiment, a plurality of ΔVth values is calculated based on the measurement results of Id-Vg in a plurality of the semiconductor devices 1. In FIG. 26, with respect to the semiconductor device according to the comparative example, a plurality of ΔVth values is calculated based on the measurement results of Id-Vg in a plurality of the semiconductor devices.

As illustrated in FIG. 26, the hysteresis (ΔVth) in the Id-Vg characteristics of the semiconductor device 1 according to the second embodiment is reduced in comparison with the hysteresis (ΔVth) in the Id-Vg characteristics of the semiconductor device according to the comparative example.

It is believed that the occurrence of the hysteresis in the Id-Vg characteristics is caused by the following factors (1) to (4):
(1) donors generated by etching the electron supply layer 5 and the cap layer 6 (forming the recess 51);
(2) donors generated by damages to the electron supply layer 5 and the cap layer 6 owing to film formation when the protection layer 8 is formed;
(3) electron traps at the interface between the electron supply layer 5 and the gate insulating film 10; and
(4) electron traps at the interface between the cap layer 6 and the gate insulating film 10.

In the semiconductor device 1 according to the first embodiment, it is believed that the number of electron traps at the interface between the cap layer 6 and the gate insulating film 10 are reduced by forming the oxidation film 9 on the exposed surface of the cap layer 6. In the first embodiment, the oxidation film 9 having uniform film quality is formed on the exposed surface of the cap layer 6 by performing a cleaning process on the exposed surface of the cap layer 6. It is believed that the electron traps at the interface between the cap layer 6 and the gate insulating film 10 are reduced by forming the oxidation film 9 having uniform film quality on the exposed surface of the cap layer 6.

Due to the fact that the electron traps at the interface between the cap layer 6 and the gate insulating film 10 are reduced, the hysteresis in the Id-Vg characteristics of the semiconductor device 1 according to the first embodiment is suppressed.

In the semiconductor device 1 according to the second embodiment, it is believed that the electron traps at the interface between the electron supply layer 5 and the gate insulating film 10 are reduced by forming the oxidation film 9 on the exposed surface of the electron supply layer 5 in the recess 51. In the second embodiment, the oxidation film 9 having uniform film quality is formed on the exposed surface of the electron supply layer 5 in the recess 51 by performing a cleaning process on the exposed surface of the electron supply layer 5 in the recess 51. It is believed that the electron traps at the interface between the electron supply layer 5 and the gate insulating film 10 are reduced by forming the oxidation film 9 having uniform film quality on the exposed surface of the electron supply layer 5 in the recess 51.

In the semiconductor device 1 according to the second embodiment, it is believed that the electron traps at the interface between the cap layer 6 and the gate insulating film 10 are reduced by forming the oxidation film 9 on the exposed surface of the cap layer 6 in the opening part 62. In the second embodiment, the oxidation film 9 having uniform film quality is formed on the exposed surface of the cap layer 6 in the recess 51 by performing a cleaning process on the exposed surface of the cap layer 6 in the recess 51. It is believed that the electron traps at the interface between the cap layer 6 and the gate insulating film 10 are reduced by forming the oxidation film 9 having uniform film quality on the exposed surface of the cap layer 6 in the recess 51.

Due to the fact that the electron traps at the interface between the electron supply layer 5 and the gate insulating film 10 are reduced and the electron traps at the interface between the cap layer 6 and the gate insulating film 10 are reduced, the hysteresis in the Id-Vg characteristics of the semiconductor device 1 according to the second embodiment is suppressed.

In the semiconductor device 1 according to the first embodiment, the oxidation film 9 is formed on the exposed surface of the cap layer 6 by performing the wet process on the exposed surface of the cap layer 6 with the liquid chemical. For example, it is believed that if the oxidation film 9 is formed on the exposed surface of the cap layer 6 by a dry process or a sputtering process with gases or the like, undulations are generated on the oxidation film 9 formed on the exposed surface of the cap layer 6. It is believed that if undulations are generated on the oxidation film 9 formed on the exposed surface of the cap layer 6, the electron traps at the interface between the electron supply layer 5 and the gate insulating film 10 are not reduced.

In the semiconductor device 1 according to the second embodiment, the oxidation film 9 is formed on the exposed surfaces of the electron supply layer 5 and the cap layer 6 in the recess 51 by performing the wet process on the exposed surfaces of the electron supply layer 5 and the cap layer 6 in the recess 51 with the liquid chemical. For example, it is believed that if the oxidation film 9 is formed on the exposed surfaces of the electron supply layer 5 and the cap layer 6 in the recess 51 by dry process or sputtering process with gases or the like, undulations are generated on the oxidation film 9 formed on the exposed surfaces of the electron supply layer 5 and the cap layer 6 in the recess 51. It is believed that if undulations are generated on the oxidation film 9 formed on the exposed surface of the electron supply layer 5 in the recess 51, the electron traps at the interface between the electron supply layer 5 and the gate insulating film 10 are not reduced. It is believed that if undulations are generated on the oxidation film 9 formed on the exposed surface of the cap layer 6 in the recess 51, the electron traps at the interface between the cap layer 6 and the gate insulating film 10 are not reduced.

In the first embodiment, the exposed surface of the cap layer 6 is etched by performing a wet process on the exposed surface of the cap layer 6 with APM. It is believed that donors are reduced by etching the exposed surface of the cap layer 6. Due to the fact that the donors are reduced, the hysteresis in the Id-Vg characteristics of the semiconductor device 1 according to the first embodiment is suppressed. In the second embodiment, the exposed surfaces of the electron supply layer 5 and the cap layer 6 in the recess 51 are etched by performing a liquid chemical treatment on the exposed surfaces of the electron supply layer 5 and the cap layer 6 in the recess 51 with APM. It is believed that donors are reduced by etching the exposed surfaces of the electron supply layer 5 and the cap layer 6 in the recess 51. Due to the fact that donors are reduced, the hysteresis in the Id-Vg characteristics of the semiconductor device 1 according to the second embodiment is suppressed.

In the first and second embodiments, after forming the gate insulating film 10, heat treatment is performed at a temperature of more than or equal to 500° C. and less than or equal to 700° C. to suppress the hysteresis in the Id-Vg characteristics of the semiconductor device 1 according to the first and second embodiments.

Figure 27:
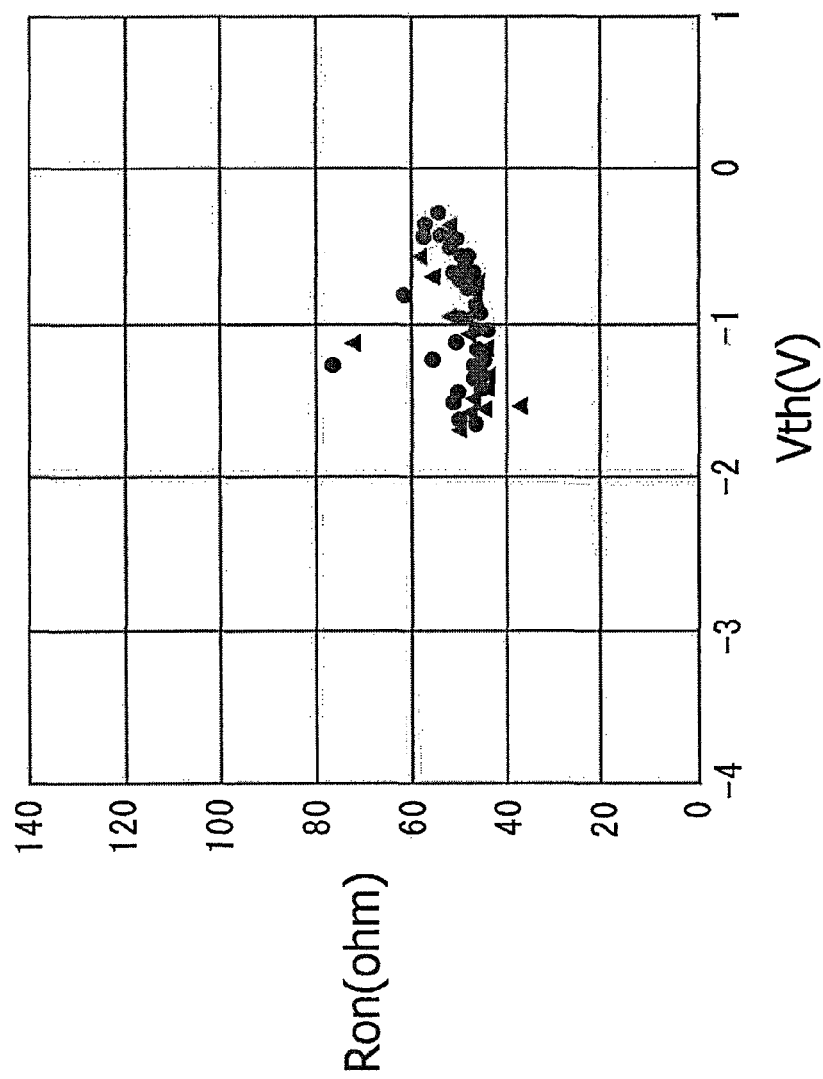
FIG. 27 is a view illustrating the relation between on-resistance and ΔVth.

FIG. 27 is a view illustrating the relation between on-resistance and ΔVth. The vertical axis in FIG. 27 is on-resistance (ohm) and the abscissa axis in FIG. 27 is Vth(V) of the Id-Vg wave (Forward). In FIG. 27, on-resistance values of the semiconductor device 1 according to the second embodiment are illustrated with black circles, while on-resistance values of the semiconductor device according to the comparative example are illustrated with black triangles. As illustrated in FIG. 27, it can be seen that little difference is present between the on-resistance values of the semiconductor device 1 according to the second embodiment and the on-resistance values of the semiconductor device according to the comparative example.

Figure 28:
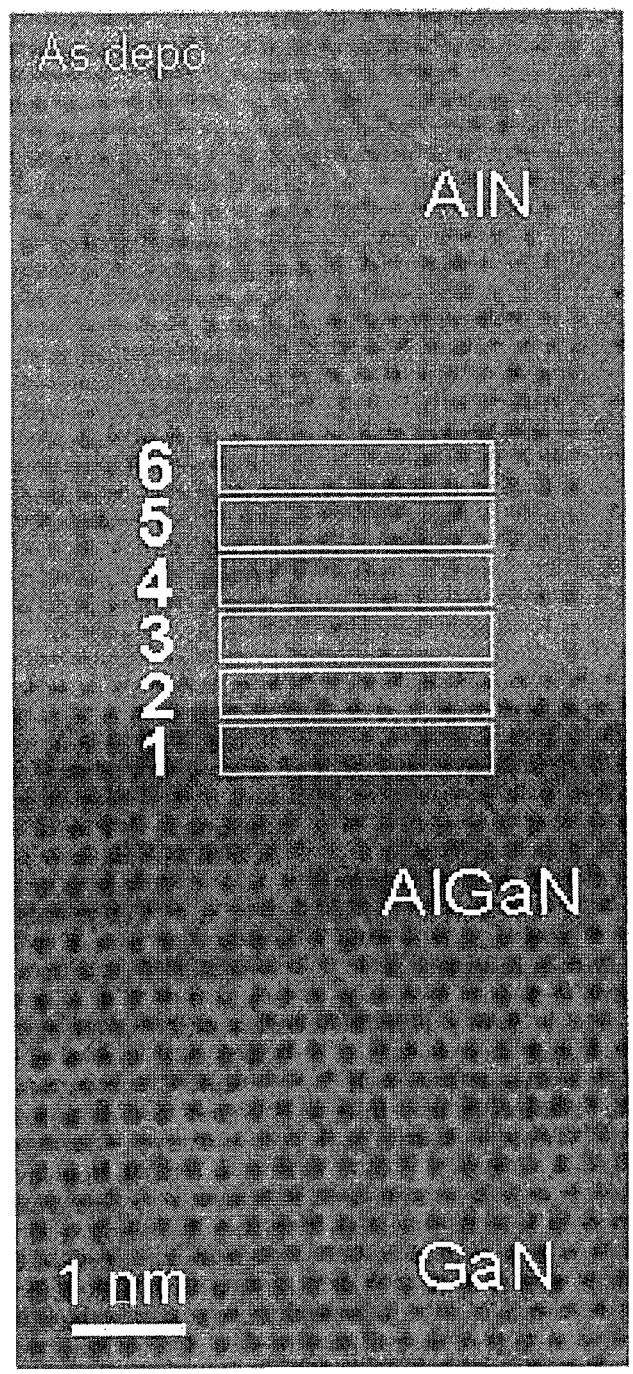
FIG. 28 is a view illustrating a cross-sectional TEM image of the semiconductor device 1 according to the second embodiment.

FIG. 28 illustrates a cross-sectional TEM (Transmission Electron Microscope) image of the semiconductor device 1 according to the second embodiment. With respect to the semiconductor device 1 according to the second embodiment illustrated in FIG. 28, the electron transit layer 4 is a GaN layer, the electron supply layer 5 is an n-AlGaN layer and the first gate insulating film 21 is an AlN film.

Figure 29:
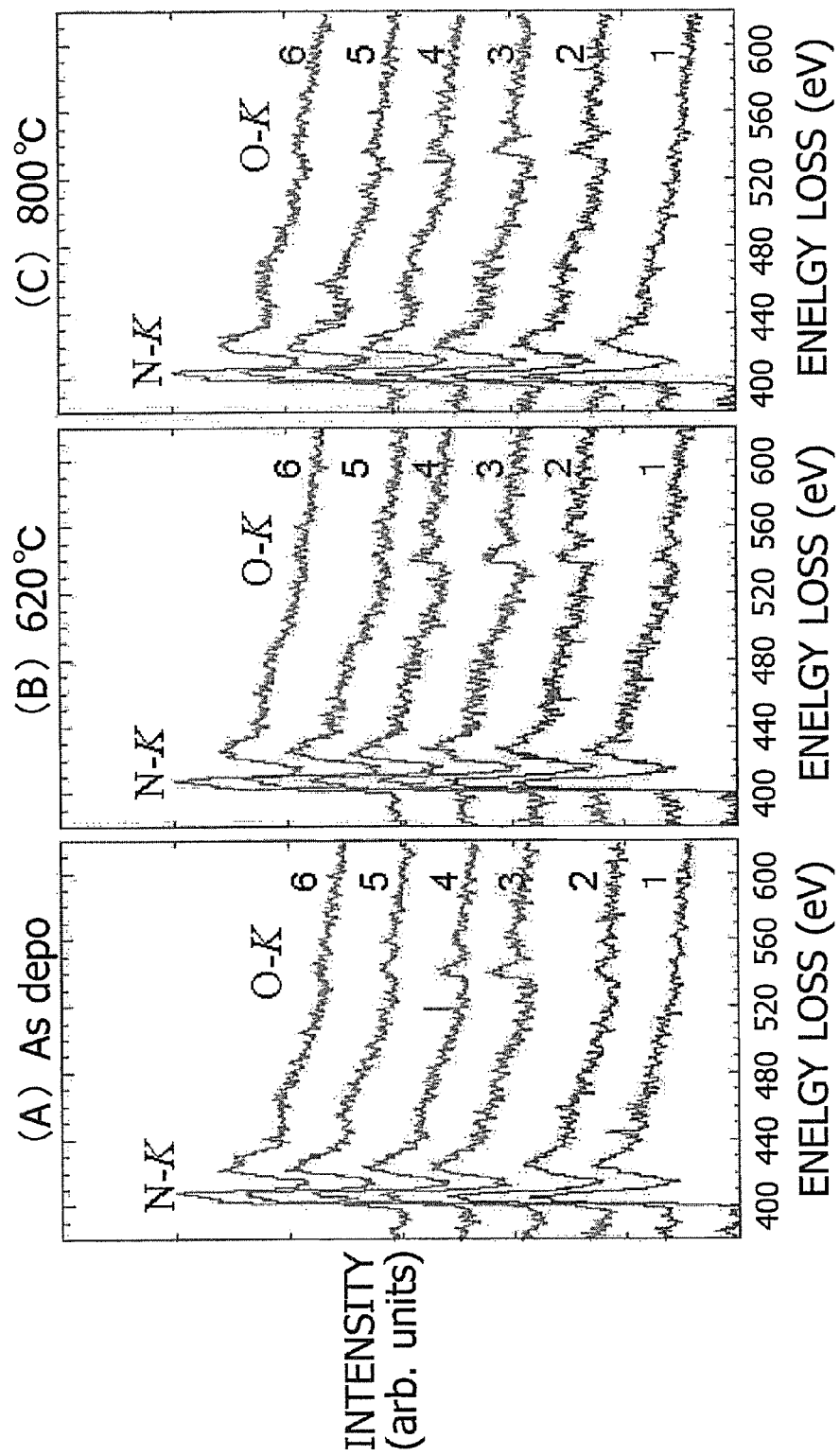
FIG. 29 is a view illustrating spectra obtained from measurement of an n-AlGaN layer and an AlN film by an EELS technique.

FIG. 29 is a view illustrating spectra obtained from measurement of the n-AlGaN layer and the AlN film by the EELS (electron energy loss spectroscopy) technique. The vertical axis in FIG. 29 is loss energy (eV) and the abscissa axis in FIG. 29 is measured intensity (arb. units). (A) As depo in FIG. 29 indicates spectra measured by the EELS technique immediately after forming the AlN film. (B) 620° C. in FIG. 29 indicates spectra measured by the EELS technique after performing heat treatment at 620° C. after forming the AlN film. (C) 800° C. in FIG. 29 indicates spectra measured by the EELS technique after performing heat treatment at 800° C. after forming AlN film.

Spectra designated by reference numerals 1 to 6 in (A) to (C) of FIG. 29 are measurement results at positions designated by reference numerals 1 to 6 in FIG. 28. As illustrated in (A) to (C) of FIG. 29, it can be seen that peaks appeared at the position of about 540 eV in loss energy and oxygen is detected from a two-atom layer in the surface of the n-AlGaN layer at the interface between the n-AlGaN layer and the AlN film, as well as an initial four-atom layer of the AlN film. Therefore, it can also be seen from the measurement results by the EELS technique that the oxidation film 9 is formed on the electron supply layer 5. Further, as illustrated in (A) to (C) of FIG. 29, it can be seen that there is no change in oxygen detection at the interface between the n-AlGaN layer and the AlN film, between the case where heat treatment is not performed and the case where heat treatment is performed. According to the embodiments, the hysteresis in the Id-Vg characteristics of the semiconductor device can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A semiconductor device comprising:
a semiconductor substrate;
an electron transit layer formed on the semiconductor substrate;
an electron supply layer formed on the electron transit layer;
a cap layer formed on the electron supply layer; and
a groove penetrating through the cap layer to reach to the inside of the electron supply layer; and
a gate insulating film formed in the groove,
wherein the electron supply layer and the cap layer have an oxidation film at the interface between the electron supply layer and the gate insulating film and at the interface between the cap layer and the gate insulating film, respectively.

2. The semiconductor device according to claim 1, wherein the electron supply layer and the cap layer comprise gallium, and
the oxidation film is a gallium oxide film.

3. A method for manufacturing a semiconductor device comprising:
forming an electron transit layer on a semiconductor substrate;
forming an electron supply layer on the electron transit layer;
forming a cap layer on the electron supply layer;
forming a groove penetrating through the cap layer to reach to the inside of the electron supply layer;
forming a gate insulating film in the groove; and
forming an oxidation film on an exposed surface of the electron supply layer and an exposed surface of the cap layer in the groove by a wet process; wherein
the oxidation film is formed at an interface between the electron supply layer and the gate insulating film and at an interface between the cap layer and the gate insulating film, respectively.

4. The method for manufacturing the semiconductor device according to claim 3, comprising cleaning the exposed surface of the electron supply layer and the exposed surface of the cap layer in the groove before forming the oxidation film.

5. The method for manufacturing the semiconductor device according to claim 3, wherein the wet process is performed with any one of ammonia-hydrogen peroxide mixture, sulfuric acid-hydrogen peroxide mixture, hydrochloric acid-hydrogen peroxide mixture and phosphoric acid.

6. The method for manufacturing the semiconductor device according to claim 3, wherein
the electron supply layer and the cap layer comprise gallium, and
the oxidation film is a gallium oxide film.

* * * * *

UNITED STATES PATENT AND TRADEMARK OFFICE
CERTIFICATE OF CORRECTION

PATENT NO. : 9,136,107 B2  
APPLICATION NO. : 14/098853  
DATED : September 15, 2015  
INVENTOR(S) : Yoshiyuki Kotani and Shinichi Akiyama Page 1 of 1

It is certified that error appears in the above-identified patent and that said Letters Patent is hereby corrected as shown below:

Title Page, Item (12) delete "Katani et al." and insert --Kotani et al.--.

Title Page, Item (72) Inventors: delete "Katani," and insert --Kotani-- therefor.

Signed and Sealed this  
Fifth Day of July, 2016

Michelle K. Lee  
*Director of the United States Patent and Trademark Office*